(12) United States Patent
Sakotsubo

(10) Patent No.: US 10,892,279 B1
(45) Date of Patent: Jan. 12, 2021

(54) NAND STRING CONTAINING SEPARATE HOLE AND ELECTRON TUNNELING DIELECTRIC LAYERS AND METHODS FOR FORMING THE SAME

(71) Applicant: SANDISK TECHNOLOGIES LLC, Addison, TX (US)

(72) Inventor: Yukihiro Sakotsubo, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/514,019

(22) Filed: Jul. 17, 2019

(51) Int. Cl.
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
None
See application file for complete search history.

(56) References Cited

U.S. PATENT DOCUMENTS

| | | | | |
|---|---|---|---|---|
| 6,586,785 B2* | 7/2003 | Flagan | ................... | B82Y 10/00 257/261 |
| 8,816,422 B2* | 8/2014 | Wang | ................ | H01L 29/40117 257/324 |
| 9,355,727 B1 | 5/2016 | Zhang et al. | | |
| 9,524,779 B2 | 12/2016 | Kai et al. | | |
| 9,530,785 B1* | 12/2016 | Koka | ................ | H01L 27/11556 |
| 9,576,971 B2 | 2/2017 | Zhang et al. | | |
| 2007/0138539 A1* | 6/2007 | Wu | ....................... | H01L 27/115 257/324 |
| 2009/0175089 A1* | 7/2009 | Eitan | ................. | H01L 29/40117 365/185.28 |
| 2011/0280077 A1* | 11/2011 | Fishburn | ............. | H01L 29/7827 365/185.18 |

(Continued)

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).

(Continued)

*Primary Examiner* — Sitaramarao S Yechuri
(74) *Attorney, Agent, or Firm* — The Marbury Law Group PLLC

(57) ABSTRACT

A three-dimensional memory device includes an alternating stack of insulating layers and electrically conductive layers located over a substrate, memory openings extending through the alternating stack, memory opening fill structures located within a respective one of the memory openings, and a gate dielectric located between the memory opening fill structures and the electrically conductive layers. Each of the memory opening fill structures includes a vertical semiconductor channel, a conductive core electrode, and a memory film located between the vertical semiconductor channel and the conductive core electrode. The memory film contains a layer stack including a first tunneling dielectric contacting the vertical semiconductor channel, a second tunneling dielectric contacting the conductive core electrode, and a charge storage layer located between the first tunneling dielectric and the second tunneling dielectric.

20 Claims, 38 Drawing Sheets

(56) References Cited

U.S. PATENT DOCUMENTS

2016/0093635 A1\* 3/2016 Rabkin ............ H01L 27/11524
  257/314
2017/0098655 A1 4/2017 Costa et al.

OTHER PUBLICATIONS

U.S. Appl. No. 15/971,525, filed May 4, 2018, SanDisk Technologies LLC.
U.S. Appl. No. 16/457,687, filed Jun. 28, 2019, SanDisk Technologies LLC.
U.S. Appl. No. 16/457,721, filed Jun. 28, 2019 SanDisk Technologies LLC.
U.S. Appl. No. 16/249,300, filed Jan. 16, 2019, SanDisk Technologies LLC.

\* cited by examiner

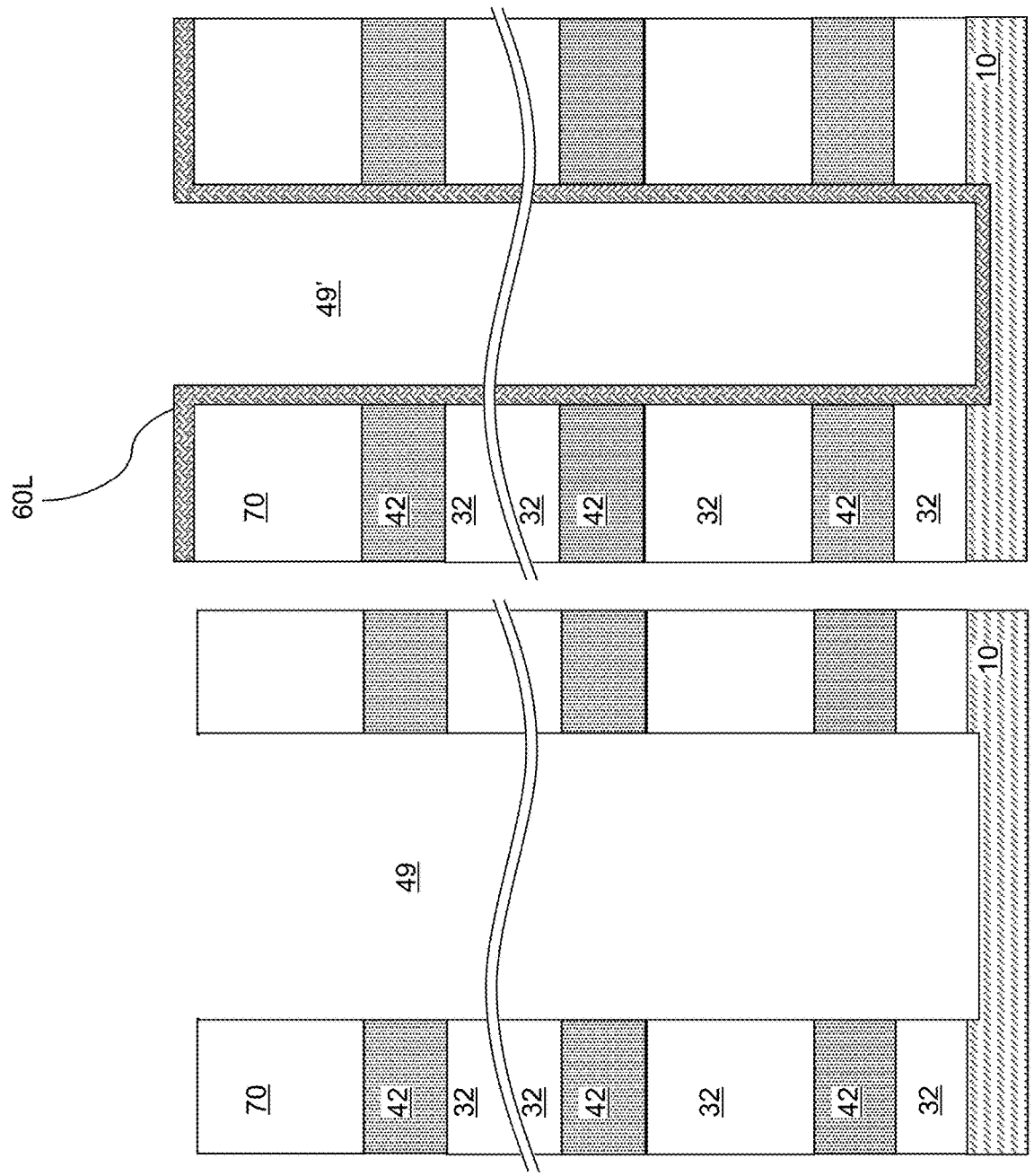

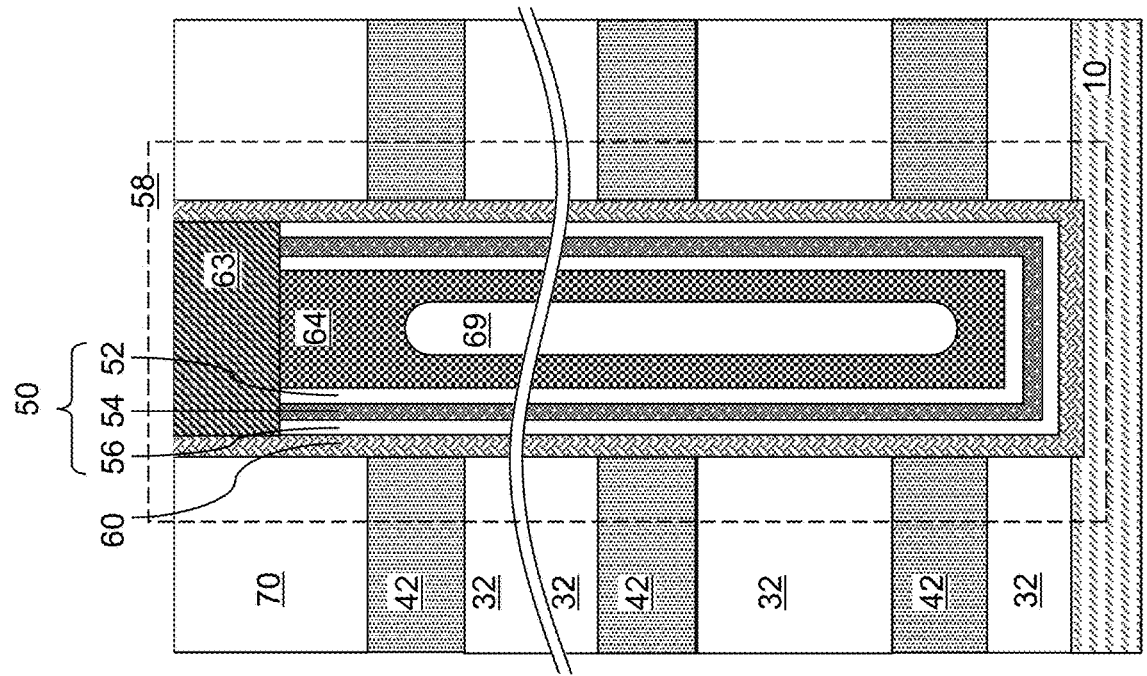
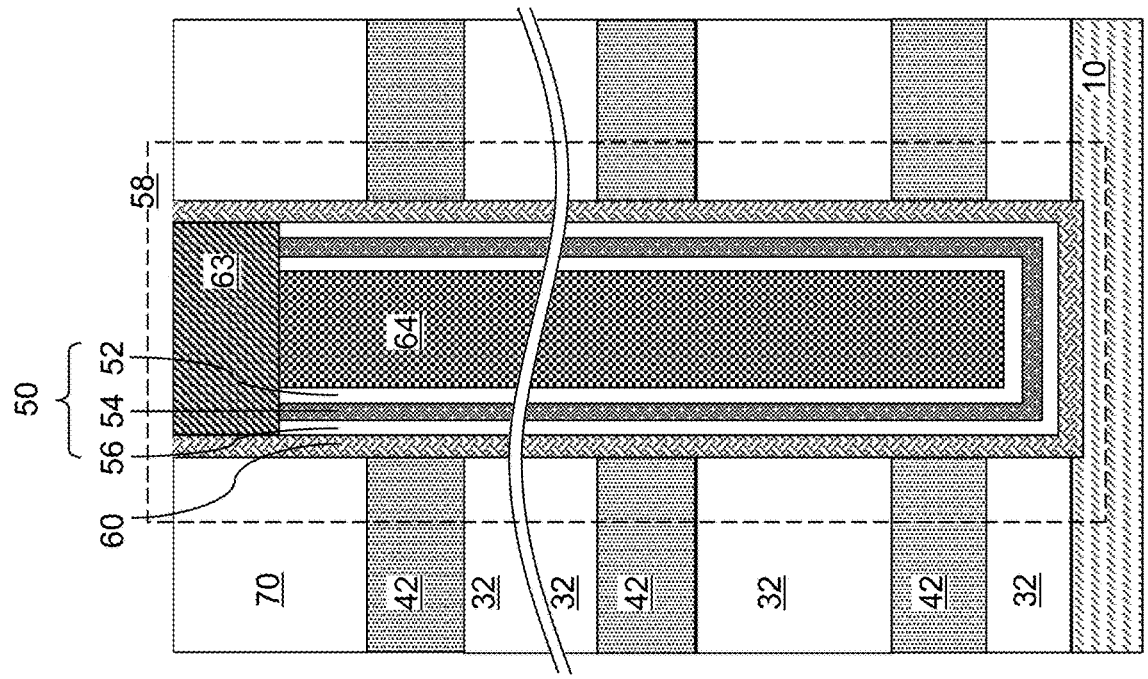
FIG. 6A
FIG. 6B

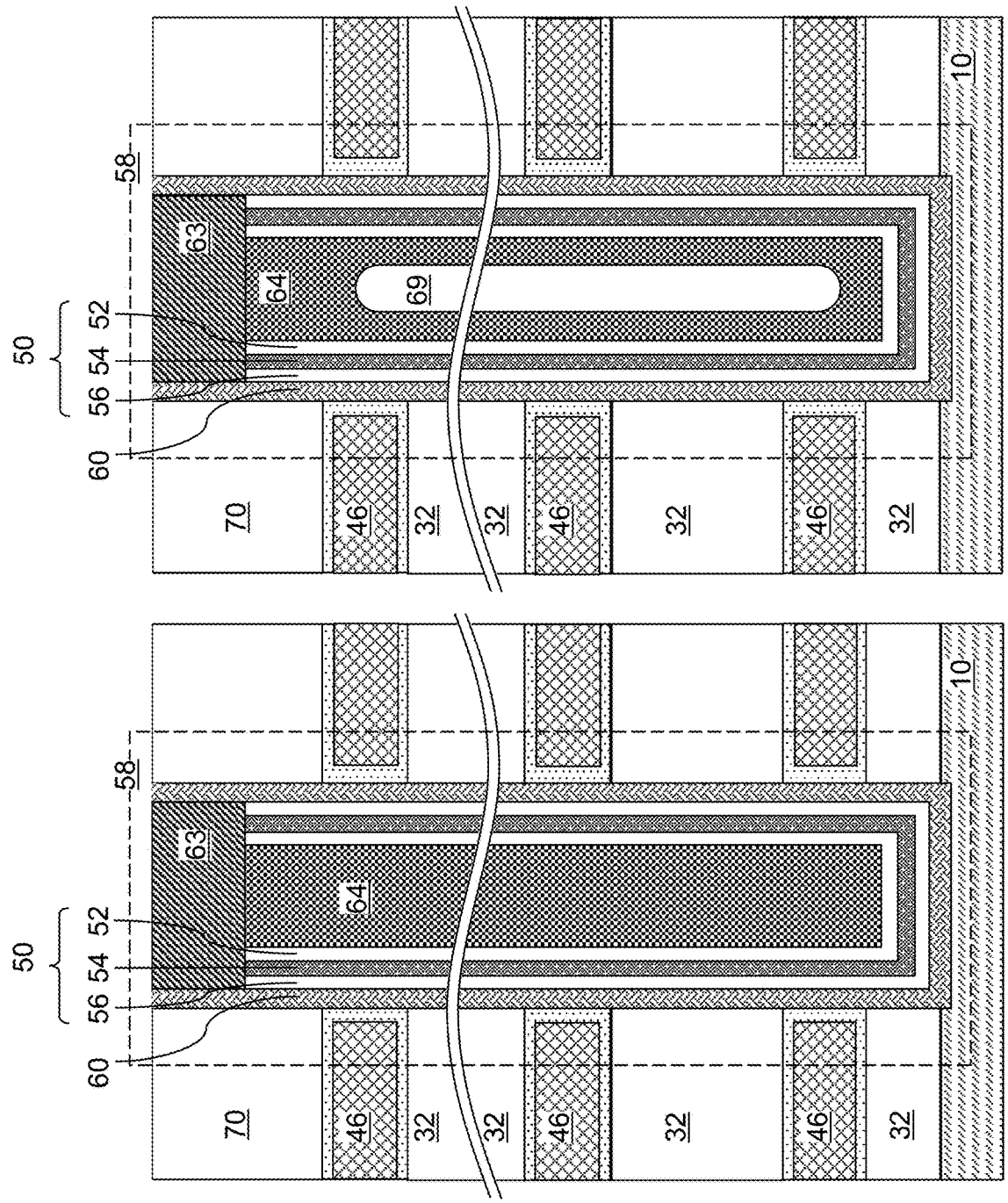

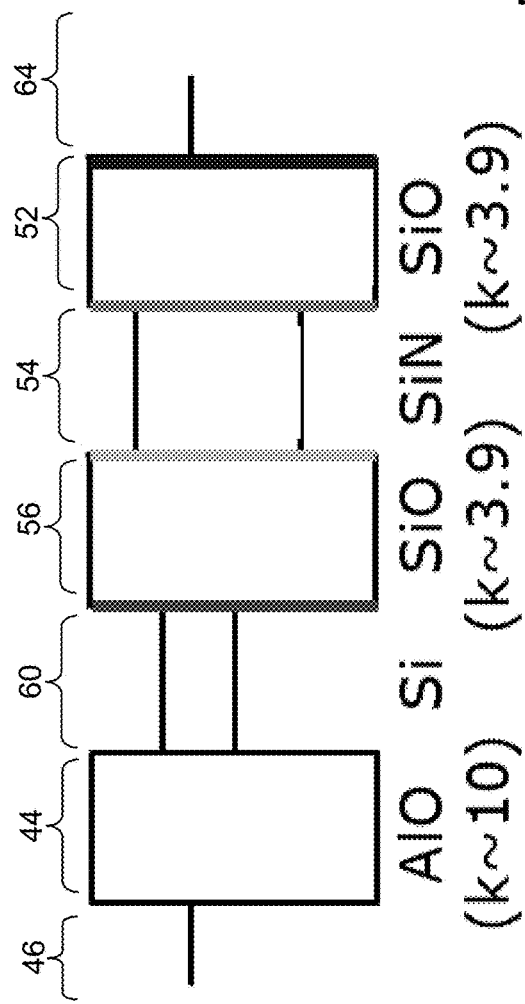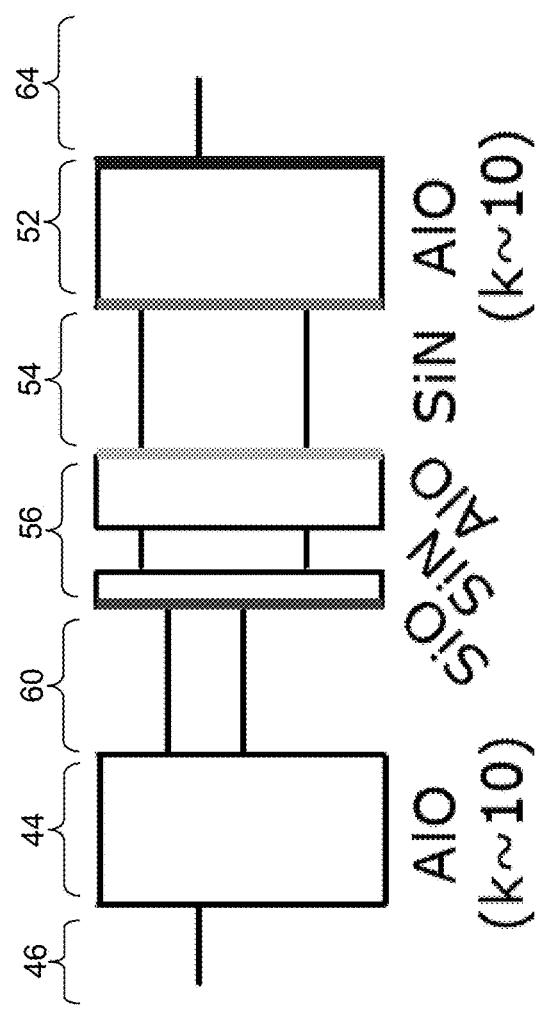
FIG. 15A
FIG. 15B

|  | PROG | ERASE | READ |
|---|---|---|---|
| BL (Inhibit channel) | 2.2V (0.0V) | 2.2V | 1.3V |
| SGD (Unsel. Strings) | 0.0V (2.3V) | 0.0V (7.6V) | 7.6V (0.0V) |
| SGDA (Unsel. Strings) | 0.0V (2.3V) | Vera+2.3V (7.6V) | 7.6V (0.0V) |
| WLsel | Vpgm | Vera-10V (8.1V) | Vcg |
| WLusel | 7.6V | Vera-10V (8.1V) | 8.1V |
| SGSA (Unsel. Blocks) | 0.0V | Vera-10V (0.0V) | 7.6V |
| SGS (Unsel. Blocks) | 0.0V | Vera-10V (Vera+2.3V) | 7.6V |
| CELSRC | 2.2V | Float | 0.9V |
| CPWELL | 0.0V | Vera | 0.9V |

FIG. 20

NAND STRING CONTAINING SEPARATE HOLE AND ELECTRON TUNNELING DIELECTRIC LAYERS AND METHODS FOR FORMING THE SAME

FIELD

The present disclosure relates generally to the field of semiconductor devices, and particular to a three-dimensional memory device including dual tunneling dielectric layers and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers located over a substrate, memory openings extending through the alternating stack, memory opening fill structures located within a respective one of the memory openings, and a gate dielectric located between the memory opening fill structures and the electrically conductive layers. Each of the memory opening fill structures includes a vertical semiconductor channel, a conductive core electrode, and a memory film located between the vertical semiconductor channel and the conductive core electrode. The memory film contains a layer stack including a first tunneling dielectric contacting the vertical semiconductor channel, a second tunneling dielectric contacting the conductive core electrode, and a charge storage layer located between the first tunneling dielectric and the second tunneling dielectric.

According to another aspect of the present disclosure, a method of forming a three-dimensional memory device is provided, which comprises forming an alternating stack of insulating layers and spacer material layers over a substrate, wherein the spacer material layers are formed as, or are subsequently replaced with, electrically conductive layers; forming memory openings extending through the alternating stack, and forming memory opening fill structures within the memory openings. Each of the memory opening fill structures includes a vertical semiconductor channel, a conductive core electrode, and a memory film located between the vertical semiconductor channel and the conductive core electrode. The memory film contains a layer stack including a first tunneling dielectric contacting the vertical semiconductor channel, a second tunneling dielectric contacting the conductive core electrode, and a charge storage layer located between the first tunneling dielectric and the second tunneling dielectric.

BRIEF DESCRIPTION OF THE DRAWINGS

FIGS. 5A-5E are sequential schematic vertical cross-sectional views of a memory opening within the exemplary structure during formation of a memory opening fill structure in a first configuration according to an embodiment of the present disclosure.

FIGS. 6A-6E are schematic vertical cross-sectional views of a memory opening fill structure in alternative configurations according to embodiments of the present disclosure.

FIGS. 12A-12E are schematic vertical cross-sectional views of the exemplary structure in alternate configurations at the processing steps of FIGS. 11A and 11B.

FIG. 15A is a band diagram for a first exemplary layer stack employed in a memory opening fill structure.

FIG. 15B is a band diagram for a second exemplary layer stack employed in a memory opening fill structure.

FIG. 20 is a table illustrating exemplary voltages that may be used to operate the devices of FIGS. 16A-16D.

DETAILED DESCRIPTION

Figure 1:
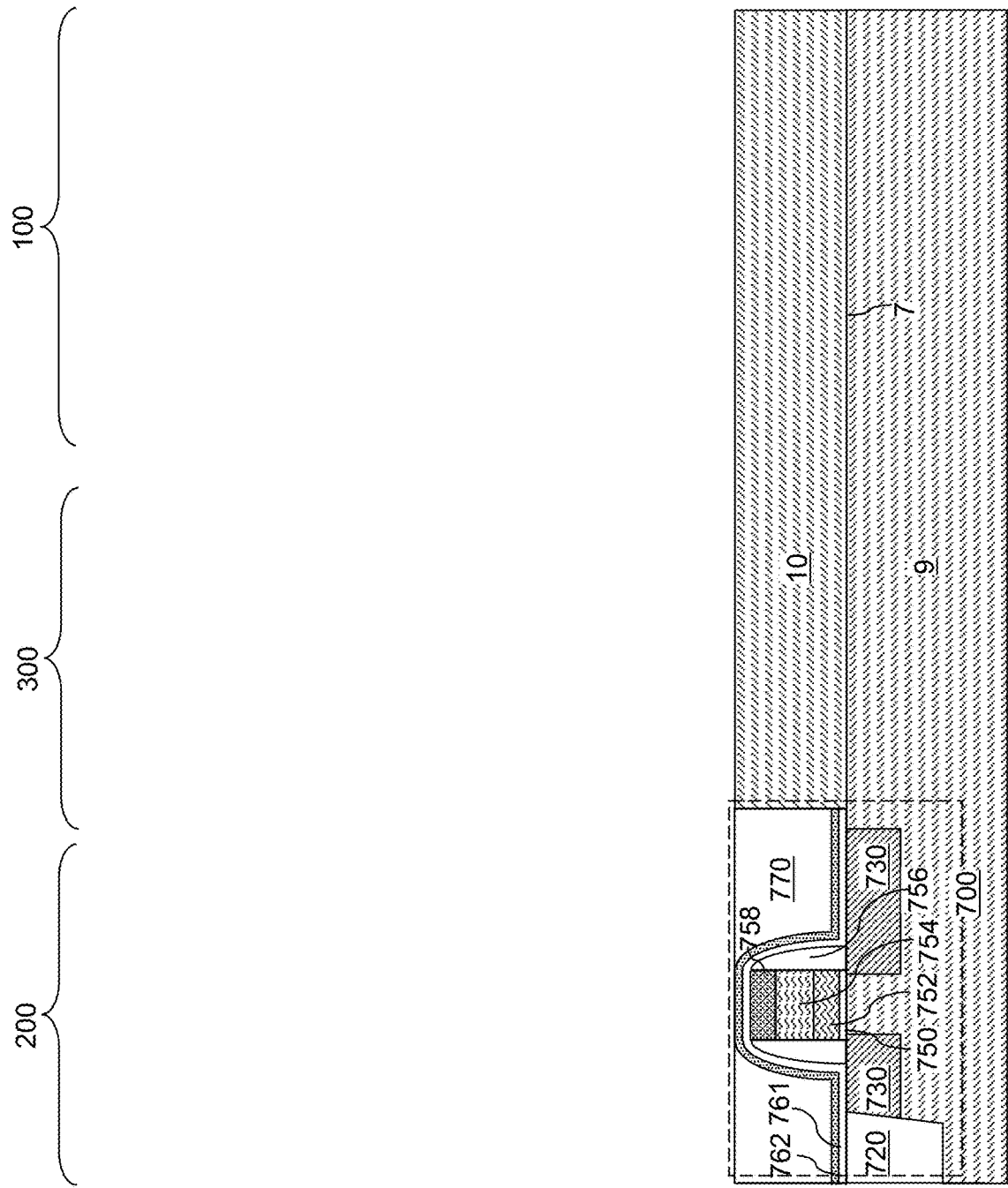
FIG. 1 is a schematic vertical cross-sectional view of an exemplary structure after formation of at least one peripheral device and a semiconductor material layer according to an embodiment of the present disclosure.

As discussed above, the present disclosure is directed to a three-dimensional memory device including a vertical NAND string containing separate electron and hole tunneling dielectric layers, and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status.

Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, at least one semiconductor device 700 for a peripheral circuitry may be formed on a portion of the substrate semiconductor layer 9. The at least one semiconductor device can include, for example, field effect transistors, such as field effect transistors in a CMOS configuration. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric layer 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200. In an alternative embodiment, the at least one semiconductor device 700 is formed under the memory array region 100 in a CMOS under array ("CUA") configuration. In this case, the peripheral device region 200 may be omitted or used in combination with the CUA configuration. In another alternative embodiment, the at least one semiconductor device 700 may be formed on a separate substrate and then bonded to substrate (9, 10) containing the memory array region 100.

Figure 2:
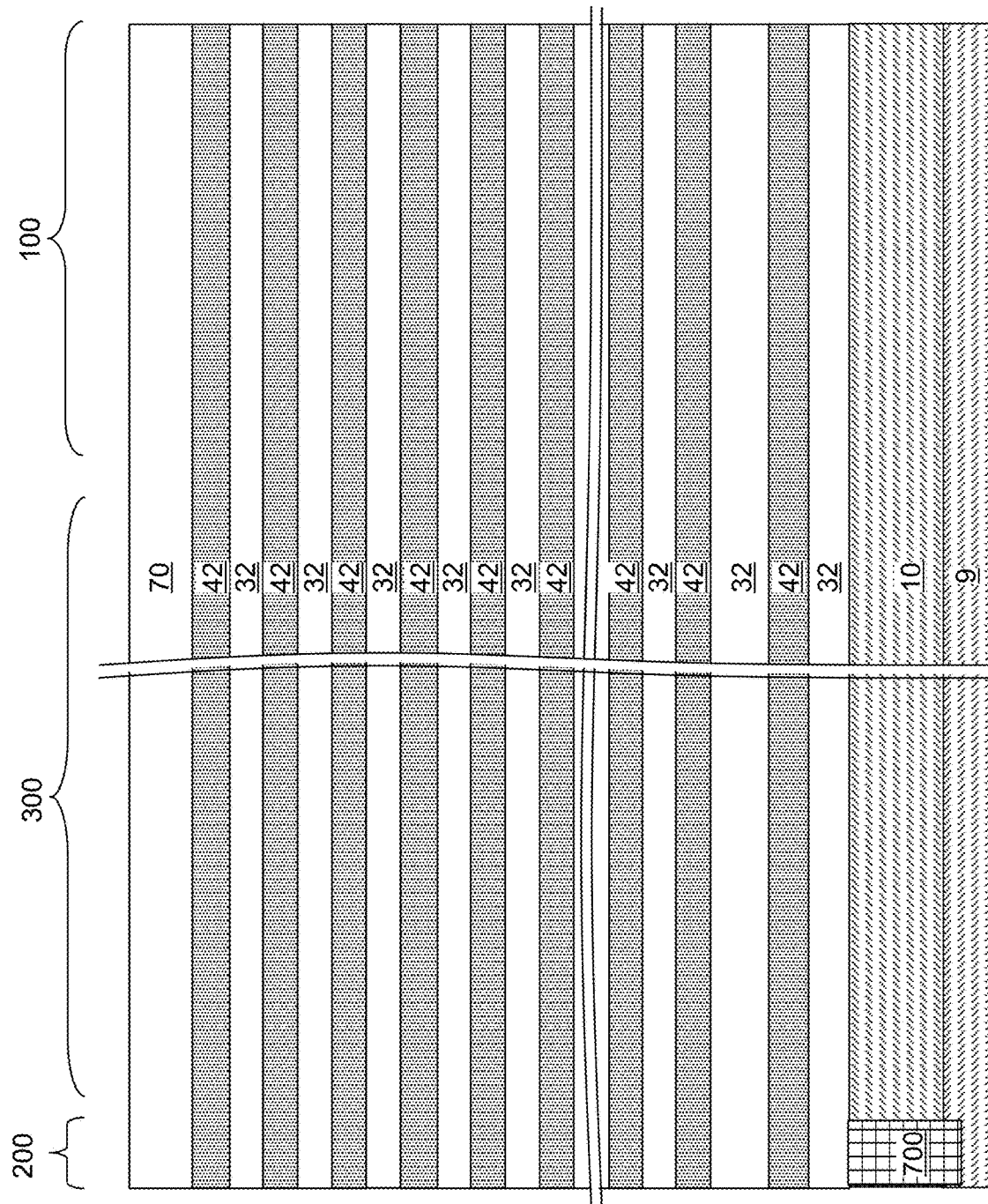
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain-select-levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
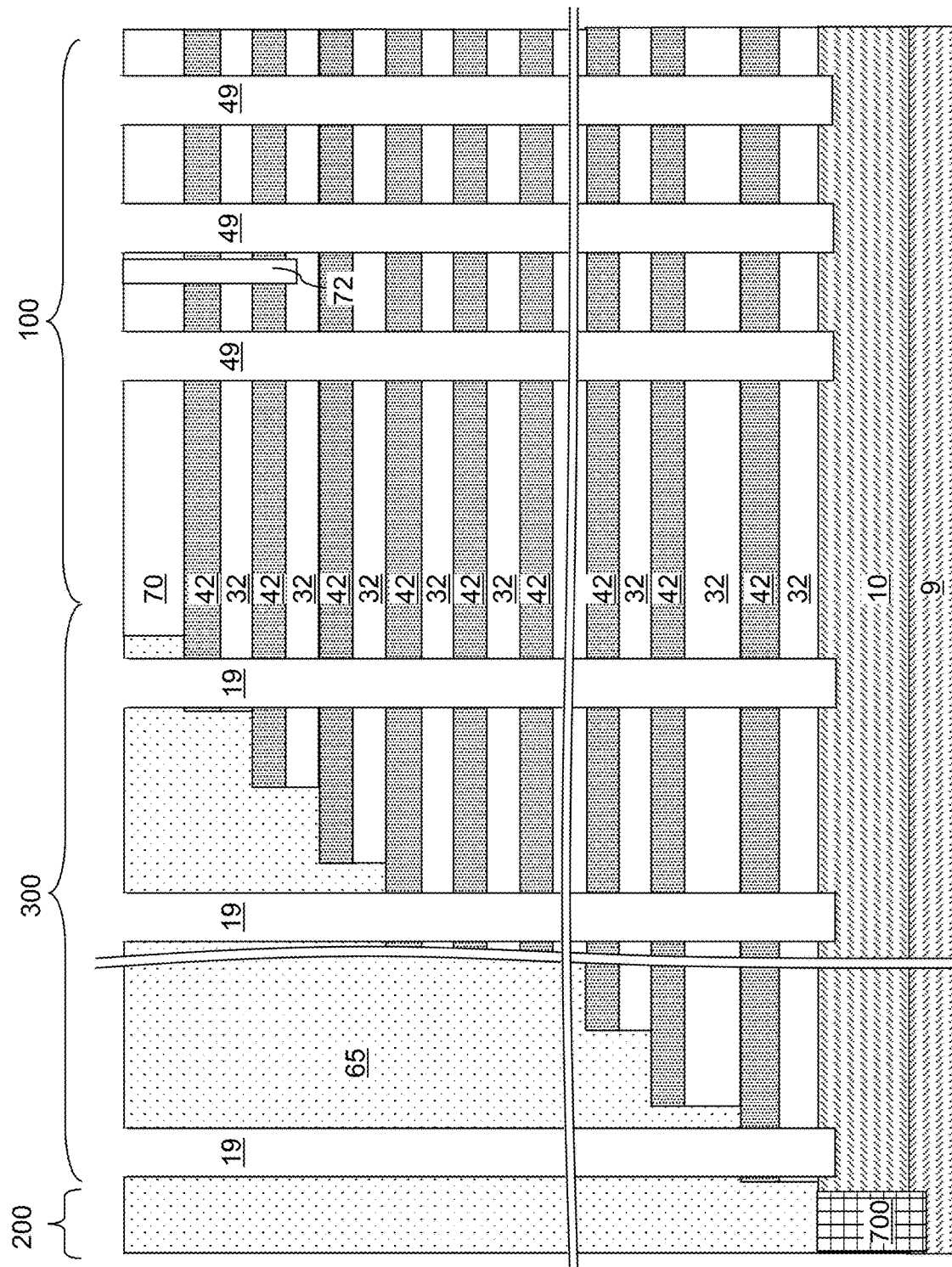
FIG. 4A is a schematic vertical cross-sectional view of the exemplary structure after formation of memory openings and support openings according to an embodiment of the present disclosure.
Figure 4B:
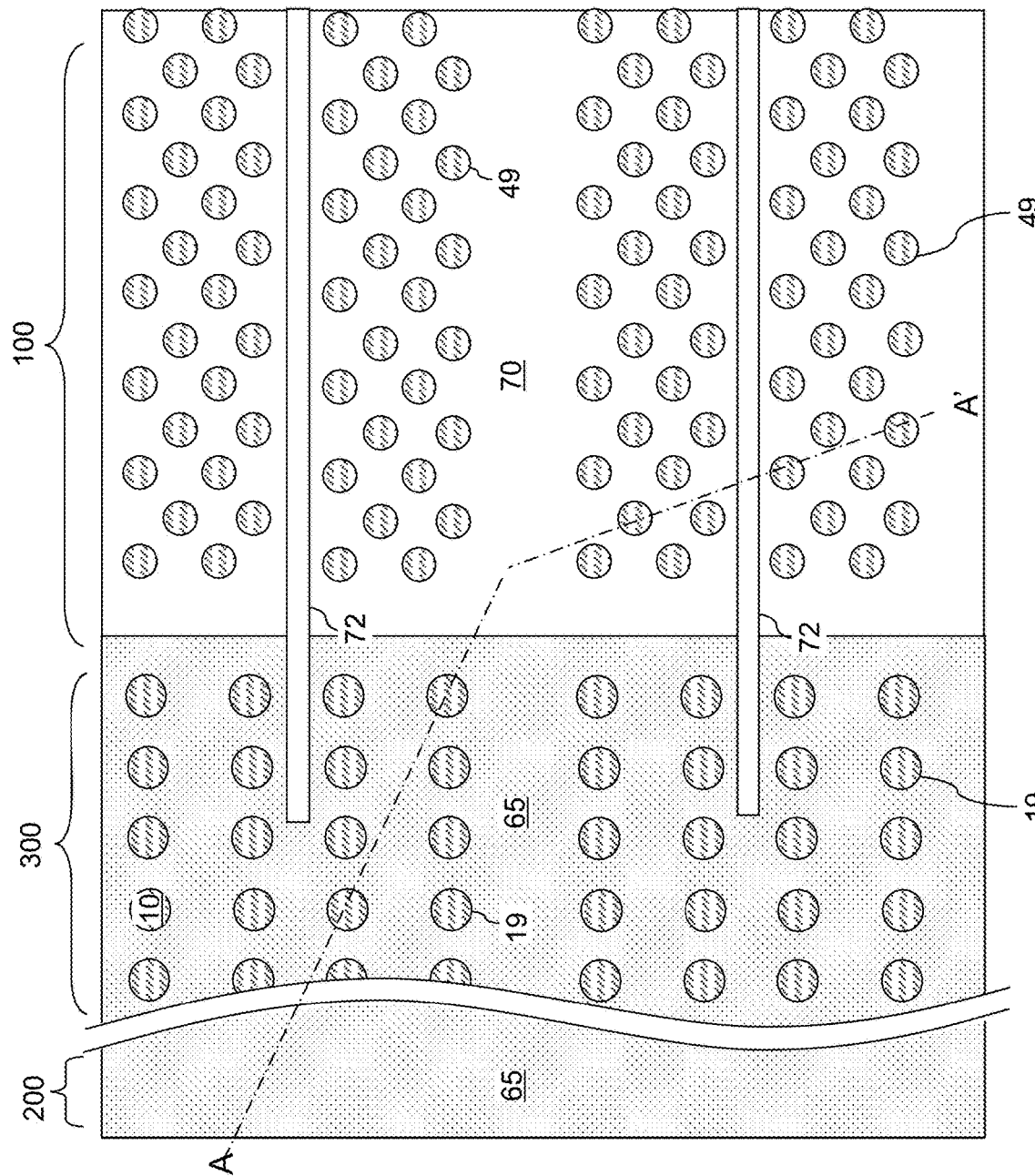
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of discrete memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5E illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, a semiconductor channel material layer 60L is deposited in the memory openings 49 and the support openings 19 by a conformal deposition process. The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The semiconductor channel material layer 60L includes a semiconductor material having a doping of the first conductivity type, which is the conductivity type of the semiconductor material layer 10. The atomic concentration of dopants of the first conductivity type in the first semiconductor channel material layer 60l can be in a range from $1.0 \times 10^{14}/cm^3$ to $1.0 \times 10^{18}/cm^3$, although lesser and greater atomic concentrations can also be employed. The thickness of the semiconductor channel material layer 60L can be in a range from 2 nm to 10 nm, although lesser and greater thicknesses can also be employed. A memory cavity 49' is present in each unfilled volume of the memory openings 49.

Figure 5D:
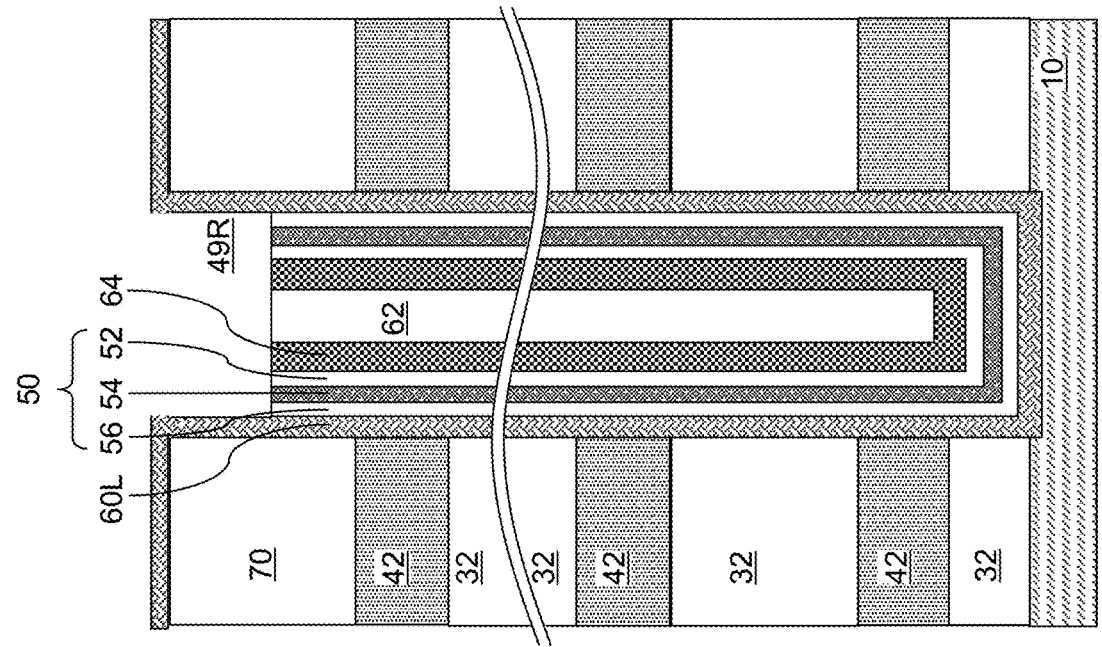
Figure 5C:
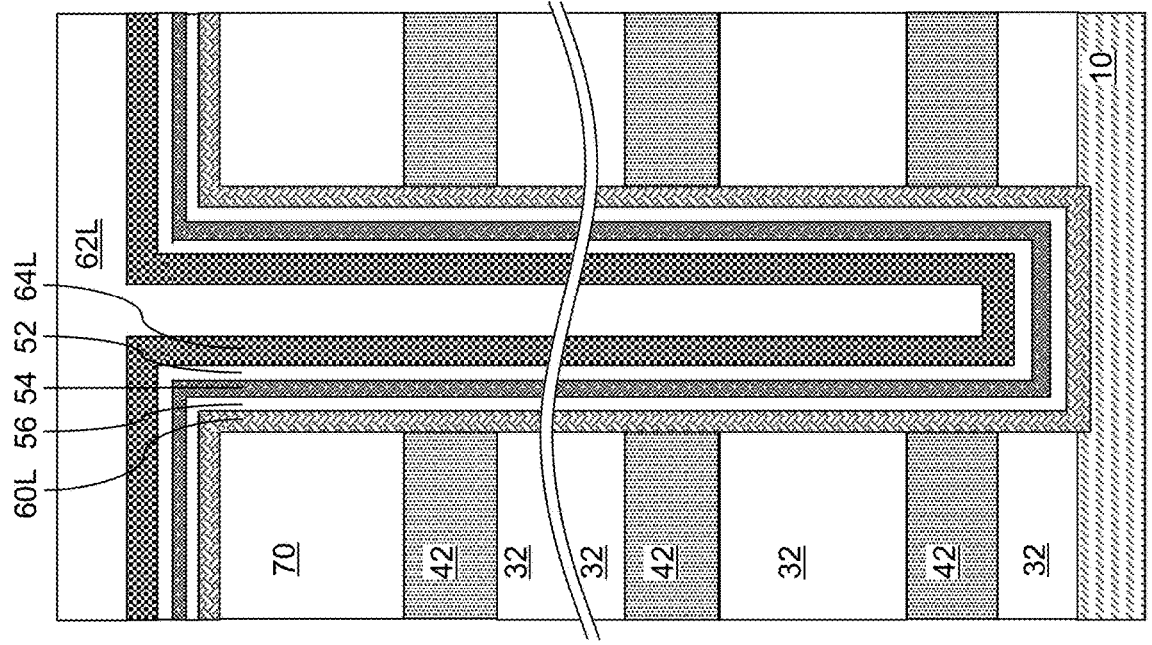

Referring to FIG. 5C, a first tunneling dielectric layer 56, a charge storage layer 54, a second tunneling dielectric layer 52, a conductive electrode layer 64L, and an optional dielectric core material layer 62L are sequentially deposited on the semiconductor channel material layer 60L in each of the memory openings 49 and the support openings 19.

The first tunneling dielectric layer 56 includes a dielectric material that is conducive to tunneling of charge carriers of the first conductivity type. For example, if the first conductivity type is p-type, then the first tunneling dielectric layer 56 includes a hole tunneling dielectric material that is conducive to hole tunneling. Alternatively, if the first conductivity type is n-type, then the first tunneling dielectric layer 56 includes a dielectric material that is conducive to electron tunneling. Generally, the first tunneling dielectric layer 56 can include any tunneling dielectric material that permits tunneling of charge carriers of the first conductivity type. For example, the first tunneling dielectric layer 56 may include one or more materials selected from silicon oxide, silicon oxynitride, silicon nitride, aluminum oxide, aluminum oxynitride, aluminum nitride, dielectric transition metal oxides (such as hafnium oxide, zirconium oxide, and tantalum oxide), and dielectric transition metal nitrides. In one embodiment, the first conductivity type is p-type, and the first tunneling dielectric layer 56 can include a silicon oxide layer consisting essentially of silicon oxide or a stack of a silicon oxide layer, a silicon nitride layer, and an aluminum oxide layer. The thickness of the first tunneling dielectric layer 56 can be in a range from 1.5 nm to 6 nm, although lesser and greater thicknesses can also be employed.

The charge storage layer 54 can be formed as a single charge storage layer of homogeneous composition, or can include a stack of multiple charge storage layers. The charge storage layer 54 comprises a continuous insulating charge trapping material such as silicon nitride, silicon oxynitride, aluminum nitride or aluminum oxynitride, or charge-trapping nanoparticles embedded in an insulating matrix. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The second tunneling dielectric layer 52 includes a dielectric material that is conducive to tunneling of charge carriers of the second conductivity type that is the opposite of the first conductivity type. If the first conductivity type is p-type, then the second conductivity type is n-type, and vice versa. Generally, the second tunneling dielectric layer 52 can include any tunneling dielectric material that permits tunneling of charge carriers of the second conductivity type. For example, the second tunneling dielectric layer 52 may include one or more materials selected from silicon oxide, silicon oxynitride, silicon nitride, aluminum oxide, aluminum oxynitride, aluminum nitride, dielectric transition metal oxides (such as hafnium oxide, zirconium oxide, and tantalum oxide), and dielectric transition metal nitrides. For example, if the second conductivity type is n-type, then the second tunneling dielectric layer 52 includes an electron tunneling dielectric material that is conducive to electron tunneling. Alternatively, if the first conductivity type is p-type, then the second tunneling dielectric layer 52 includes a dielectric material that is conducive to hole tunneling. In one embodiment, the first conductivity type is p-type, the second conductivity type is n-type, and the second tunneling dielectric layer 52 can include a silicon oxide layer consisting essentially of silicon oxide or an aluminum oxide layer. The thickness of the second tunneling dielectric layer 26 can be in a range from 1.5 nm to 6 nm, although lesser and greater thicknesses can also be employed.

Generally, the material of the first tunneling dielectric material layer 56 and the material of the second tunneling dielectric material layer 52 may be independently selected to optimize tunneling of charge carriers of the first conductivity type through the first tunneling dielectric material layer 56 and to optimize tunneling of charge carriers of the second conductivity type through the second tunneling dielectric material layer 52. The material of the first tunneling dielectric material layer 56 and the material of the second tunneling dielectric material layer 52 may be the same, or may be different. In one embodiment, the first tunneling dielectric layer 56 comprises, and/or consists essentially of, a first silicon oxide layer, and the second tunneling dielectric layer 52 comprises, and/or consists essentially of, a second silicon oxide layer. In another embodiment, the first tunneling dielectric layer 56 comprises, and/or consists of, a stack of a silicon oxide layer, a silicon nitride layer, and an aluminum oxide layer, and the second tunneling dielectric layer 52 comprises, and/or consists of, an aluminum oxide layer.

The conductive electrode layer 64L can be formed on each inner sidewall of the second tunneling dielectric layer 52, and can vertically extend through each level of the sacrificial material layers 42, which are the levels of electrically conductive layers to subsequently replace the sacrificial material layers 42. The conductive electrode layer 64L includes at least one conductive material, which may include a metallic material, a metal-semiconductor compound, or a heavily doped semiconductor material having a doping of the second conductivity type. In case a metallic material is employed for the conductive electrode layer 64L, a metallic barrier layer including a conductive metal nitride (TiN, TaN, or WN) or a conductive metallic carbide (TiC, TaC, or WC) can be employed alone or in conjunction with an elemental metal (such as W, Mo, Ru, Co, or Cu) or an intermetallic alloy. In case a metal-semiconductor compound is employed for the conductive electrode layer 64L, the metal-semiconductor compound can include a metal silicide, a metal germanide, or a metal germane-silicide. In case a heavily doped semiconductor material is employed for the conductive electrode layer 64L, the heavily doped semiconductor material may include amorphous silicon, polysilicon or a silicon-germanium alloy of the second conductivity type including dopants of the second conductivity type at an atomic concentration in a range from $5.0 \times 10^{18}/cm^3$ to $2.0 \times 10^{21}/cm^3$, although lesser and greater atomic concentrations can also be employed. The thickness of the conductive electrode layer 64L can be in a range from 3 nm to 60 nm, or the conductive electrode layer 64L may fill the entire volume within each memory opening 49 or within each support opening 19 defined by the inner sidewalls of the second tunneling dielectric layer 52. If the conductive electrode layer 64L fills the entire volume within each memory opening 49 or within each support opening 19 defined by the inner sidewalls of the second tunneling dielectric layer 52, formation of the dielectric core layer 62L can be omitted, as will be described below with respect to FIG. 6A.

The dielectric core layer 62L includes a dielectric material such as undoped silicate glass (e.g., silicon oxide), a doped silicate glass, or organosilicate glass. The dielectric core layer 62L can fill remaining unfilled volumes of the memory openings 49 and the support openings 19 after formation of the conductive electrode layer 64L.

Referring to FIG. 5D, horizontal portions of the first tunneling dielectric layer 56, the charge storage layer 54, the second tunneling dielectric layer 52, the conductive electrode layer 64L, and the dielectric core material layer 62L that overlie the horizontal plane including the top surface of the insulating cap layer 70 can be removed by a planarization process. The planarization process can employ a recess etch process and/or a chemical mechanical planarization process, which may optionally use the top surface of the semiconductor channel material layer 60L as a planarization (e.g., polish or etch) stop.

Further, the first tunneling dielectric layer 56, the charge storage layer 54, the second tunneling dielectric layer 52, the conductive electrode layer 64L, and the dielectric core material layer 62L, may be vertically recessed such that each remaining portion of the first tunneling dielectric layer 56, the charge storage layer 54, the second tunneling dielectric layer 52, the conductive electrode layer 64L, and the dielectric core material layer 62L in a respective memory opening 49 or in a respective support opening 19 has a top surface between the horizontal plane including the top surface of the insulating cap layer 70 and the horizontal plane including the bottom surface of the insulating cap layer 70. A recess cavity 49R is formed in an upper portion of each memory opening 49 and in an upper portion of each support opening 19. Optionally, the semiconductor channel material layer 60L may either be recessed or remain over the insulating cap layer 70 after this step.

The recessed conductive electrode layer 64L comprises conductive core electrodes 64 located within a respective one of the memory openings 49 or within a respective one of the support openings 19. The recessed dielectric core material layer 62L comprises dielectric cores 62 located within a respective one of the memory openings 49 or within a respective one of the support openings 19. Each contiguous set of a first tunneling dielectric layer 56, a charge storage layer 54, and a second tunneling dielectric layer 53 constitutes a memory film 50.

Figure 5E:
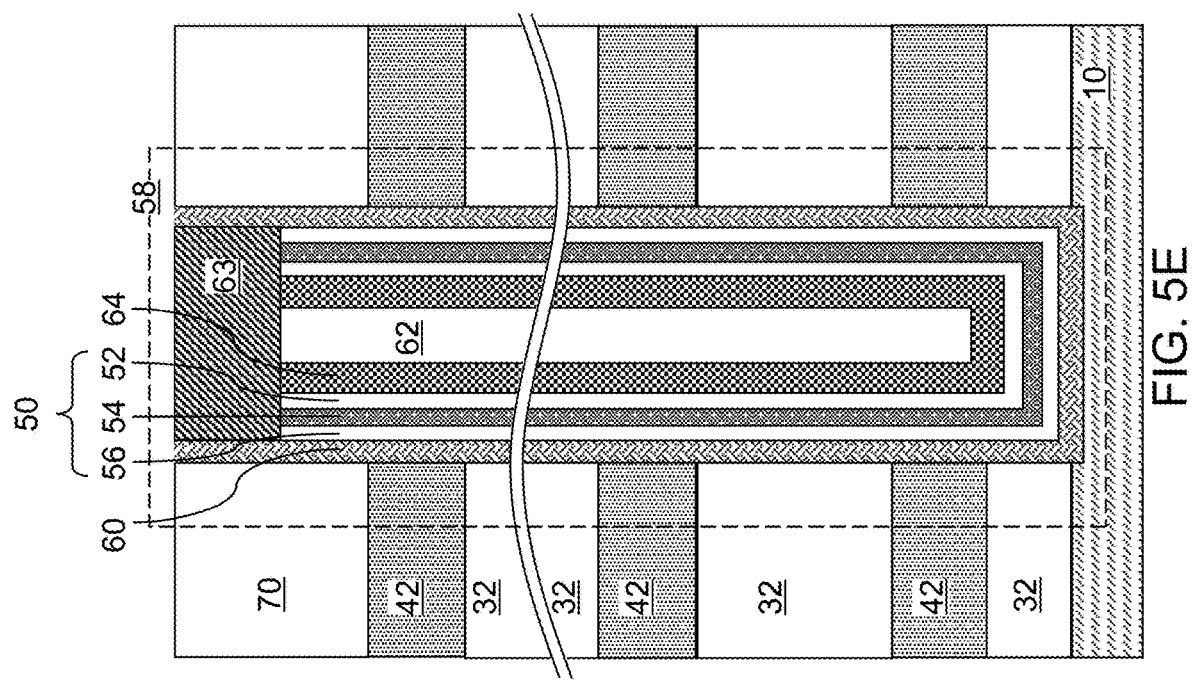

Referring to FIG. 5E, a doped semiconductor material having a doping of the second conductivity type (e.g., n-type) is deposited in the recess cavities 49R. The doped semiconductor material includes dopants of the second conductivity type at an atomic concentration in a range from $5.0 \times 10^{18}/cm^3$ to $2.0 \times 10^{21}/cm^3$, although lesser and greater atomic concentrations can also be employed. Excess portions of the doped semiconductor material and the semiconductor channel material layer 60L can be removed from above the horizontal plane including the top surface of the insulating cap layer 70 by a planarization process, which can employ a recess etch or a chemical mechanical planarization process. Each remaining portion of the doped semiconductor material constitutes a drain region 63. Each remaining portion of the semiconductor channel material layer 60L constitutes a vertical semiconductor channel 60.

A memory stack structure, which is referred to herein as an "opening fill structure" 58 is formed within each memory opening 49. A support pillar structure is formed within each support opening 19. Each of the memory opening fill structures 58 and the support pillar structures can include a cylinder shaped vertical semiconductor channel 60, a cylinder shaped memory film 50, a cylinder shaped conductive core electrode 64, a drain region 63, and optionally a dielectric core 62.

Each of the vertical semiconductor channel 60, the first tunneling dielectric layer 56, the charge storage layer 54, and the second tunneling dielectric layer 52 can have a respective cylindrical portion having a respective tubular horizontal cross-sectional shape and a planar bottom portion adjoined to a bottom edge of the respective cylindrical portion. Alternatively, if the memory openings 49 have a shape other than that of a cylinder (e.g., rectangle, triangle, etc. horizontal cross sectional shape), then the elements located in the memory opening 49 have similar shape as the memory opening.

The first tunneling dielectric layer 56 can contact an inner sidewall of the vertical semiconductor channel 60, and the charge storage layer 54 can contact an inner sidewall of the first tunneling dielectric layer 56. The second tunneling dielectric layer 52 can contact an inner sidewall of the charge storage layer 54, and the conductive core electrode 64 contacts an inner sidewall of the second tunneling dielectric layer 52. The semiconductor material layer 10 underlies the alternating stack (32, 42), and each of the vertical semiconductor channels 60 contacts, and is electrically connected to, the semiconductor material layer 10. Since the vertical semiconductor channel 60 is located on the outside of the memory film 50 in the memory opening 49, an anisotropic etch of the bottom of the memory film 50 is not required to provide electrical contact between the vertical semiconductor channel 60 and the semiconductor material layer 10. This simplifies the process of the present embodiment. A drain region 63 contacts a top end of each of the vertical semiconductor channels 60. In one embodiment, each of the memory opening fill structures 58 comprises a dielectric core 62 that is laterally surrounded by the conductive core electrode 64, and a drain region 63 contacting a top surface of the dielectric core 62.

FIGS. 6A-6E are schematic vertical cross-sectional views of a memory opening fill structure 58 in alternative configurations according to embodiments of the present disclosure.

FIG. 6A illustrates an embodiment in which formation of the dielectric core layer 62L is omitted. In this case, the thickness of the conductive electrode layer 64L is selected such that the conductive electrode layer 64L fills the entire unfilled volume of each memory opening 49 and each support opening 19 that remains after formation of the second tunneling dielectric layer 52. In this case, each conductive core electrode 64 can have a filled cylindrical shape. A conductive core electrode 64 can fill the entire volume within a second tunneling dielectric layer 52 without a void as illustrated in FIG. 6A.

Referring to FIG. 6B, a conductive electrode layer 64L may be formed by a non-conformal deposition process. In this case, a conductive core electrode 64 may contain a void (i.e., air gap) 69 therein.

Figure 6D:
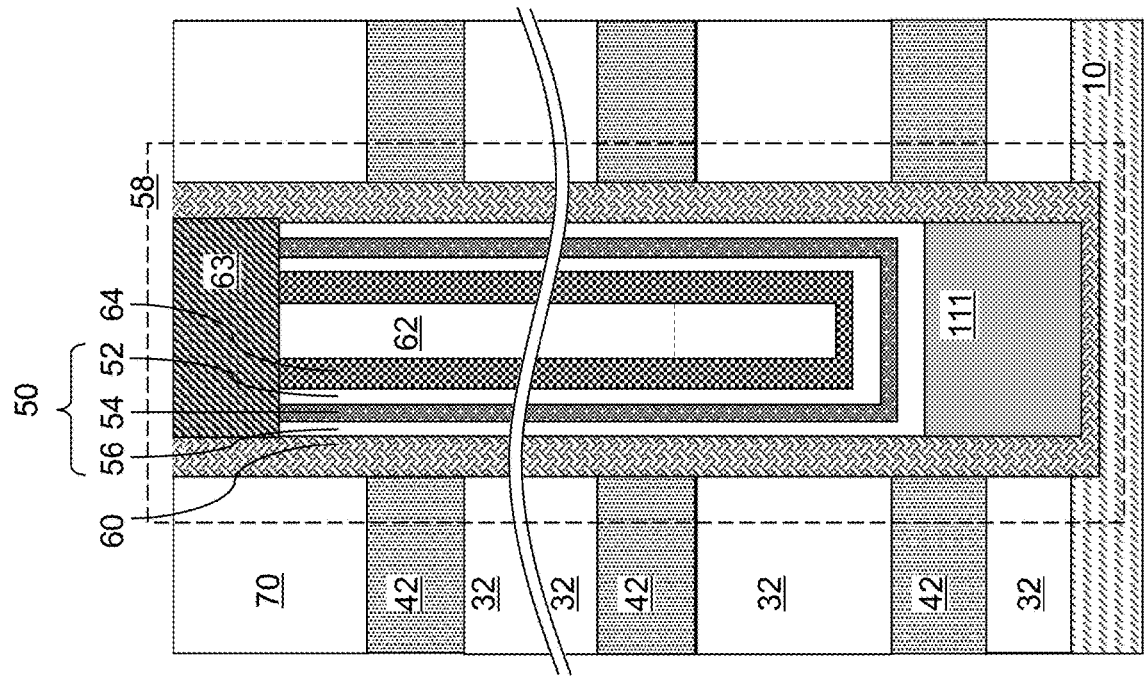
Figure 6C:
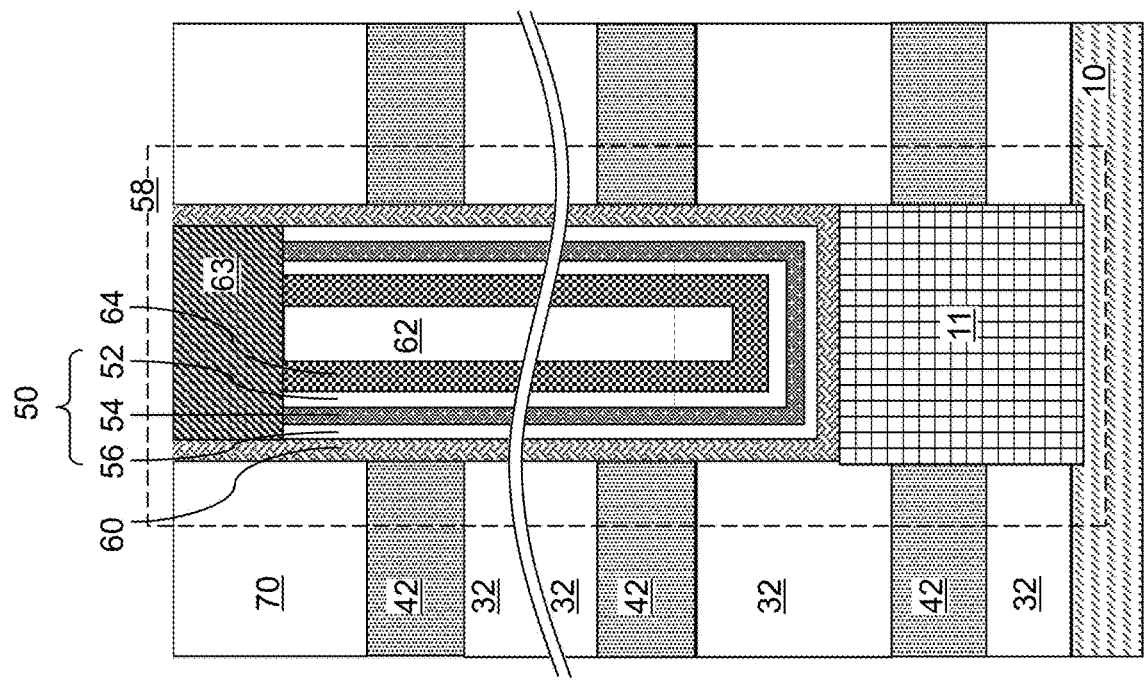

Referring to FIG. 6C, a pedestal channel portion 11 having a doping of a first conductivity type can be formed at the bottom of each memory opening 49 by a selective semiconductor deposition process, such as a selective epitaxy process. In this case, a bottom surface of a vertical semiconductor channel 60 can be formed directly on the top surface of the pedestal channel portion 11. The semiconductor material layer 10 underlies the alternating stack (32, 42), and each of the vertical semiconductor channels 60 is electrically connected to the semiconductor material layer 10 through a respective pedestal channel portion 11. In this case, each of the memory opening fill structures 58 comprises a pedestal channel portion 11 contacting a top surface of the semiconductor material layer 10 and bottom surfaces of a respective vertical semiconductor channel 60. Each pedestal channel portion 11 may comprise a single crystalline semiconductor material, such as single crystal silicon.

Referring to FIG. 6D, another configuration for the memory opening fill structure 58 is illustrated, which can be derived from the configuration illustrated in FIG. 6C by replacing the pedestal channel portion 11 with an insulating spacer 111. The insulating spacer 111 may comprise any suitable insulating material, such as silicon oxide or dielectric metal oxide. The insulating spacer 111 may be formed over the horizontal bottom surface of the vertical semiconductor channel 60 and under the bottom horizontal surface of the memory film 50. Thus, the insulating spacer 111 may be formed after formation of layer 60L by forming an insulating material in the memory opening 49, followed by recessing the insulating material to form the insulating spacer 111, followed by forming the layers of the memory film 50 over the insulating spacer 111.

Figure 6E:
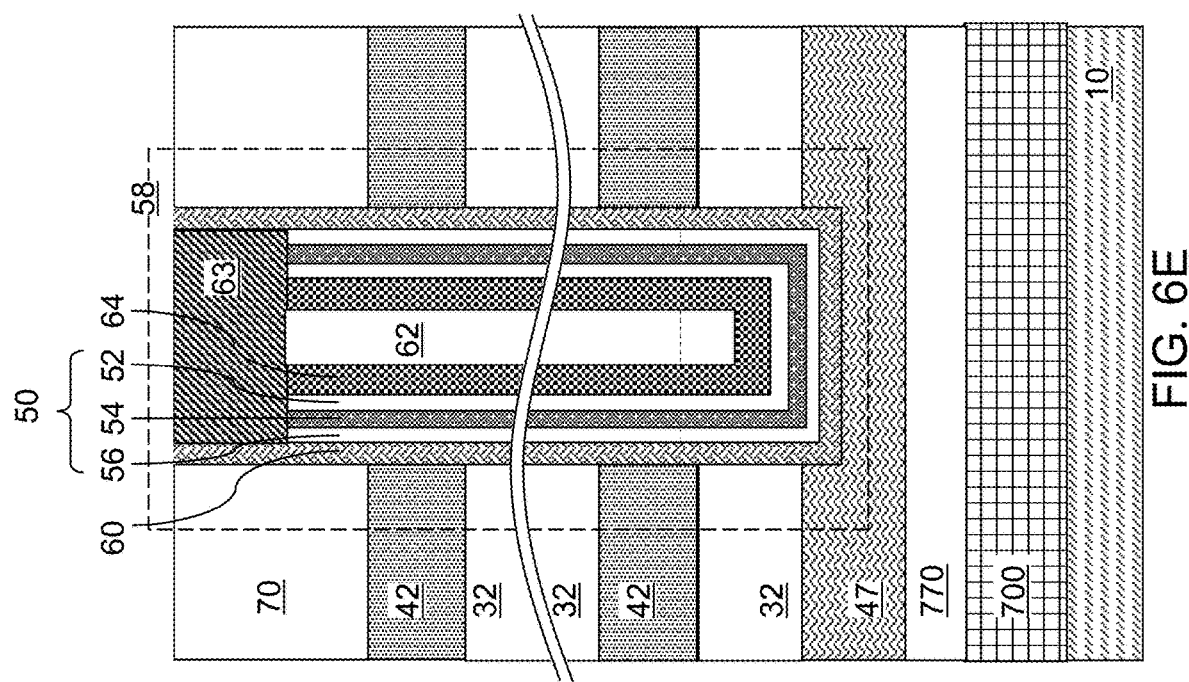

Referring to FIG. 6E, a CUA configuration is shown in which the at least one semiconductor device 700 is formed below the alternating stack (32, 42). At least one dielectric layer 770 separates the at least one semiconductor device 700 from the alternating stack (32, 42). A source-level sacrificial layer 47 is formed over the dielectric layer 770 and the semiconductor material layer 10. The source-level sacrificial layer can include amorphous silicon, a silicon-germanium alloy, organosilicate glass, borosilicate glass, or a polymer material. The bottom surface of each vertical semiconductor channel 60 can be formed on a horizontal surface of the source-level sacrificial layer 47.

Figure 7:
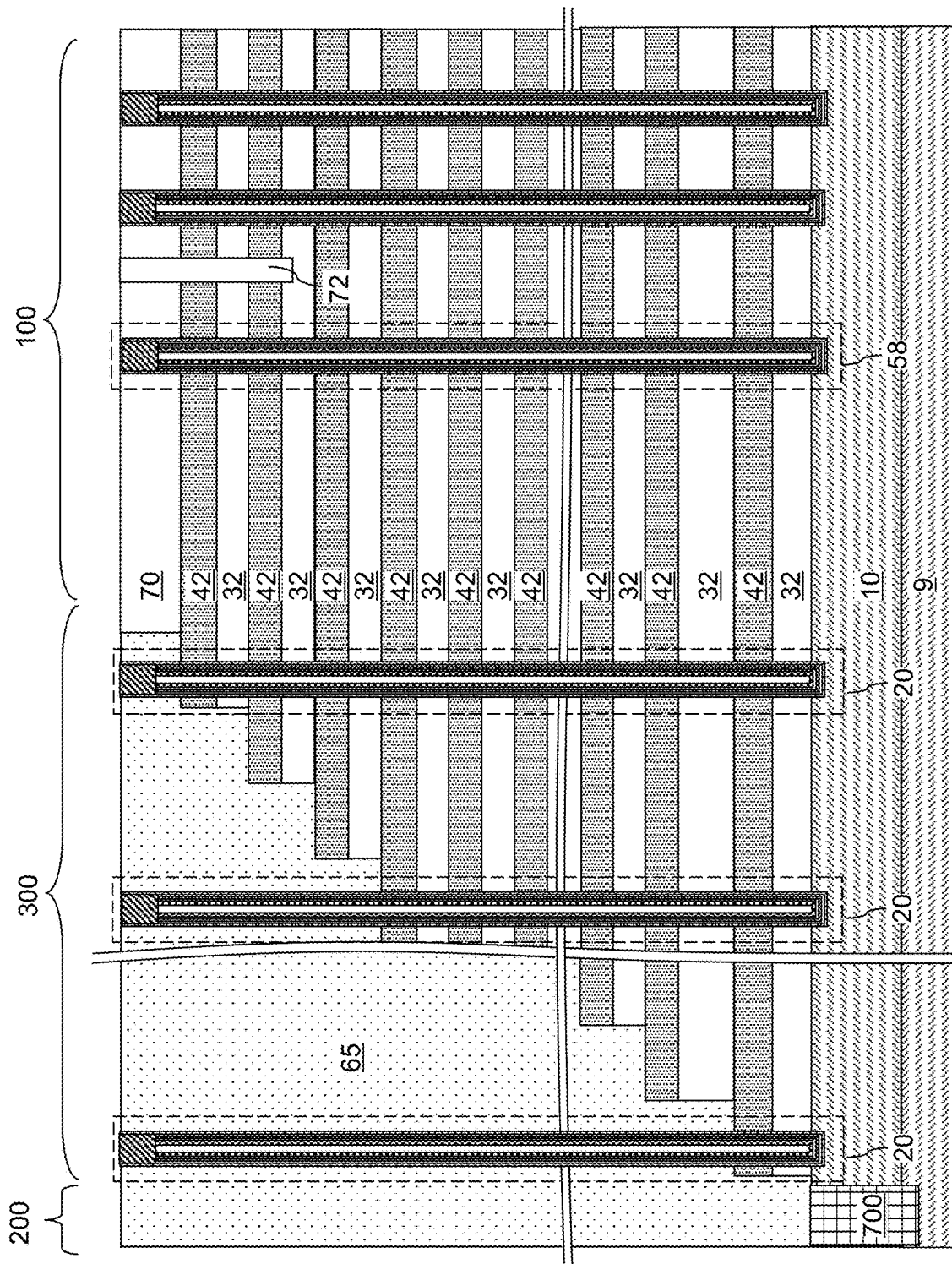
FIG. 7 is a schematic vertical cross-sectional view of the exemplary structure after formation of memory stack structures and support pillar structures according to an embodiment of the present disclosure.

Referring to FIG. 7, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Figure 8A:
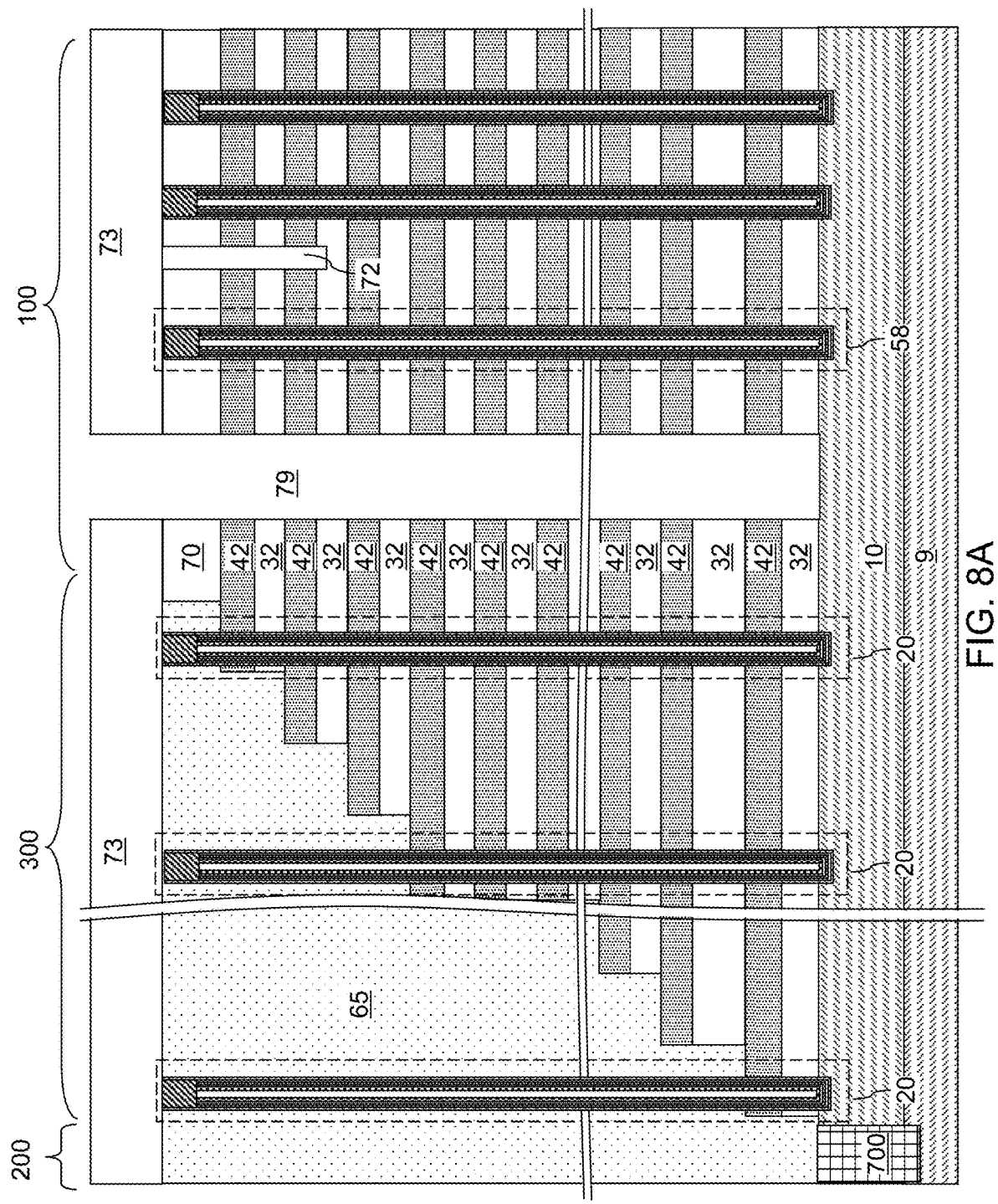
FIG. 8A is a schematic vertical cross-sectional view of the exemplary structure after formation of backside trenches according to an embodiment of the present disclosure.
Figure 8B:
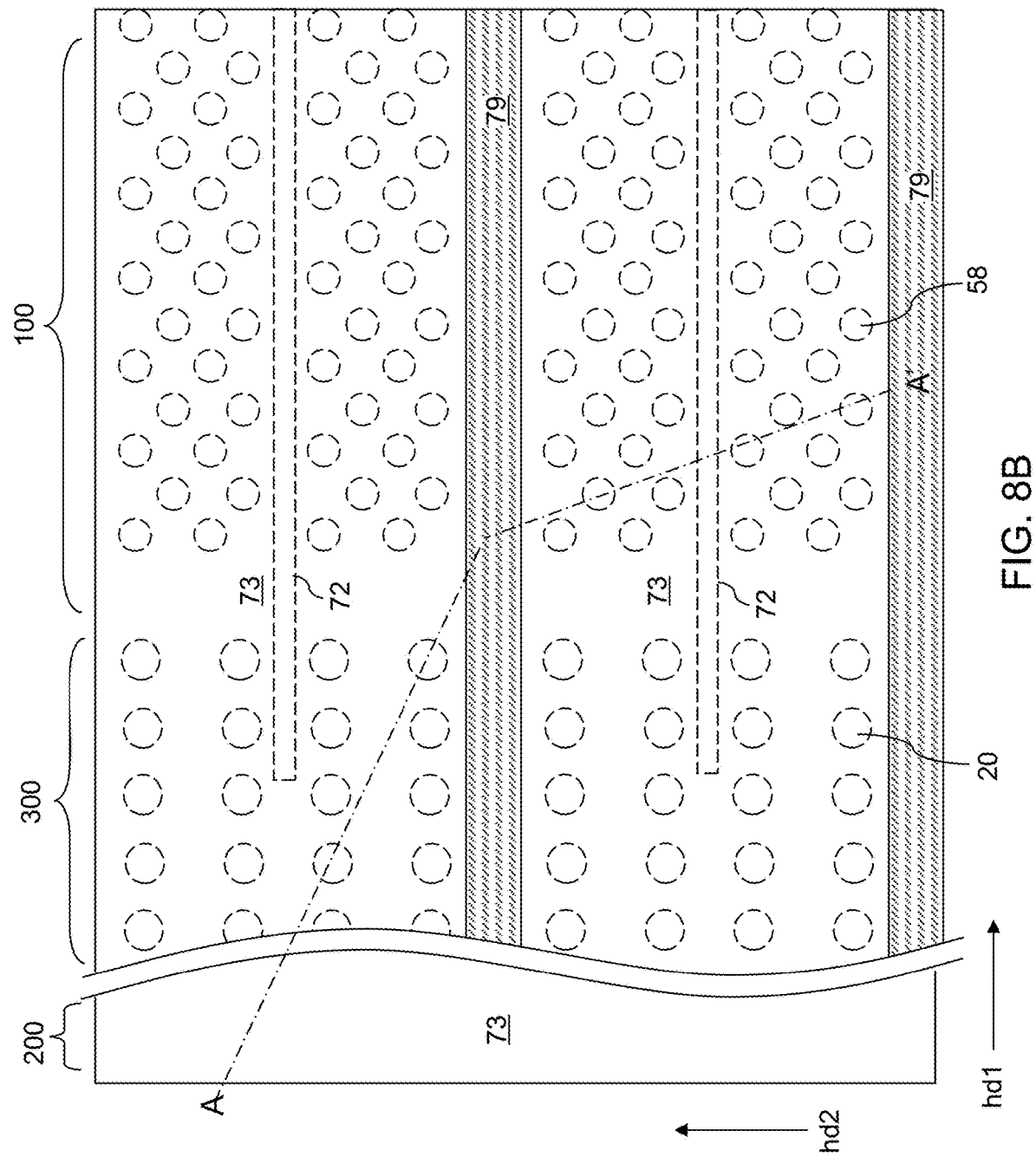
FIG. 8B is a partial see-through top-down view of the exemplary structure of FIG. 8A. The vertical plane A-A' is the plane of the schematic vertical cross-sectional view of FIG. 8A.

Referring to FIGS. 8A and 8B, a contact level dielectric layer 73 can be formed over the alternating stack (32, 42) of insulating layer 32 and sacrificial material layers 42, and over the memory opening fill structures 58 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory opening fill structures 58. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory opening fill structures 58 can be arranged in rows that extend along the first horizontal direction hd1. The drain-select-level isolation structures 72 can laterally extend along the first horizontal direction hd1.

Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 9:
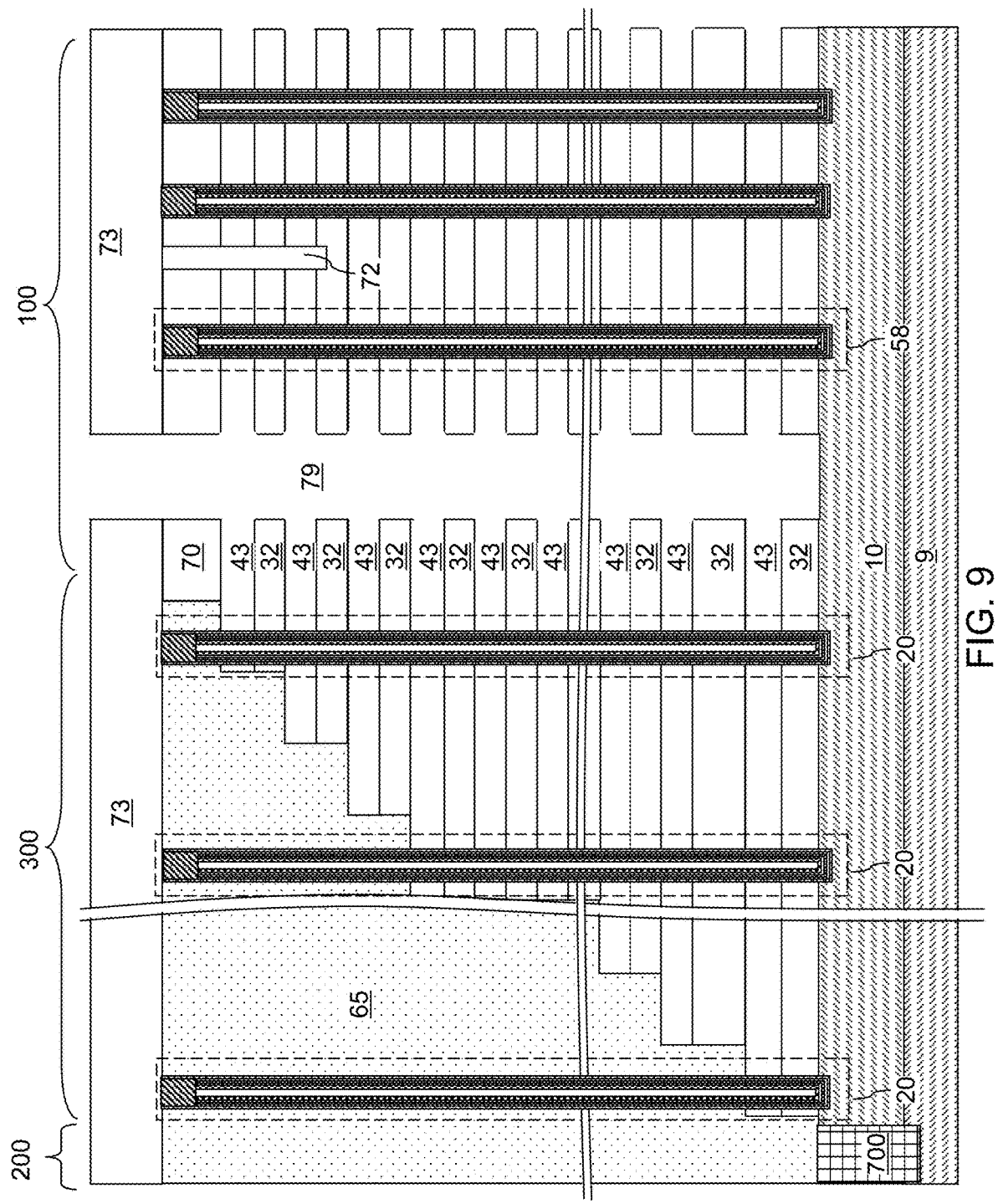
FIG. 9 is a schematic vertical cross-sectional view of the exemplary structure after formation of backside recesses according to an embodiment of the present disclosure.

Referring to FIG. 9, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the vertical semiconductor channel 60. In one embodiment, the sacrificial material layers 42 can include silicon nitride, and the materials of the insulating layers 32 and the retro-stepped dielectric material portion 65 can be selected from silicon oxide and dielectric metal oxides.

The etch process may be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory opening fill structures 58 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 10:
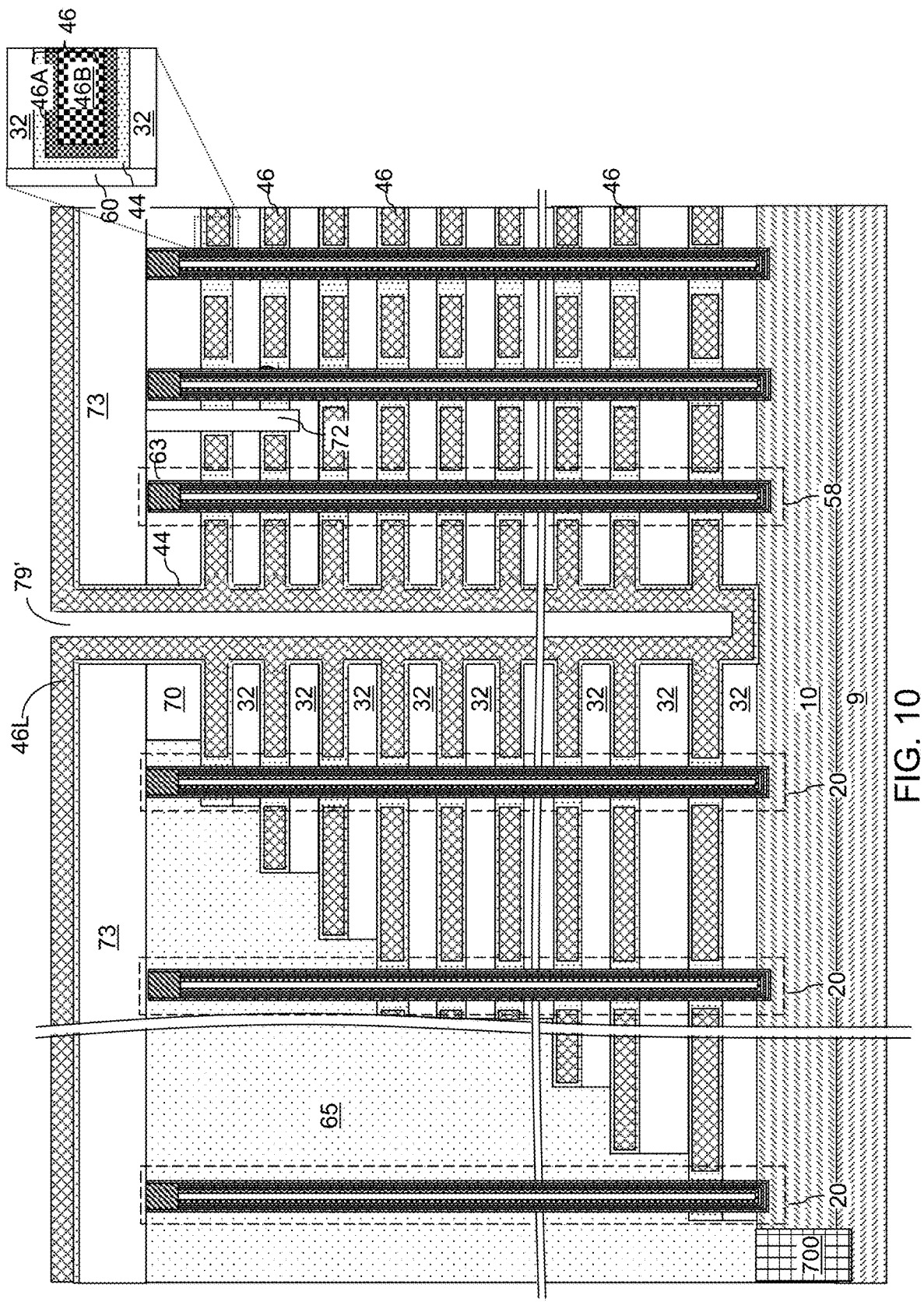
FIG. 10 is a schematic vertical cross-sectional view of the exemplary structure after formation of electrically conductive layers according to an embodiment of the present disclosure.

Referring to FIG. 10, a gate dielectric layer 44 can be optionally formed. The gate dielectric layer 44, if present, comprises a dielectric material that functions as a control gate dielectric for the control gates to be subsequently formed in the backside recesses 43.

The gate dielectric layer 44 can be formed in the backside recesses 43 and on a sidewall of the backside trench 79. The gate dielectric layer 44 can be formed directly on horizontal surfaces of the insulating layers 32 and sidewalls of the memory opening fill structures 58 within the backside recesses 43. In one embodiment, the exposed outer surface of the vertical semiconductor channel 60 may be oxidized through the backside recesses 43 by dry or wet oxidation to form portions of the gate dielectric layer 44 on the outer surface of the vertical semiconductor channel 60 exposed in the backside recesses 43. Alternatively, the gate dielectric layer 44 can be formed by a conformal deposition process, such as atomic layer deposition (ALD) or chemical vapor deposition (CVD). The thickness of the gate dielectric layer 44 can be in a range from 1 nm to 15 nm, such as 2 to 6 nm, although lesser and greater thicknesses can also be employed.

The dielectric material of the gate dielectric layer 44 can be silicon oxide, a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. For example, the gate dielectric layer 44 can consist essentially of aluminum oxide or silicon oxide.

If the gate dielectric layer 44 is formed by oxidation of a silicon vertical semiconductor channel 60, then the gate dielectric layer 44 may comprise silicon oxide. In this case, the gate dielectric layer 44 is not formed on the sidewalls of the backside trenches 79, horizontal surfaces or sidewalls of the insulating layers 32.

Alternatively, if the gate dielectric layer 44 is deposited by a conformal deposition method, such as chemical vapor deposition or atomic layer deposition, then the gate dielectric layer 44 may comprise a metal oxide, such as aluminum oxide. In this case, the gate dielectric layer 44 is formed on the sidewalls of the backside trenches 79, horizontal surfaces and sidewalls of the insulating layers 32, and the portions of the sidewall surface of the memory opening fill structures 58 (i.e., outer sidewall surface of the vertical semiconductor channel 60) that is physically exposed to the backside recesses 43. A backside cavity 79' is present within the portion of each backside trench 79 that is not filled with the gate dielectric layer 44.

A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory opening fill structures 58 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the gate dielectric layer 44 and the continuous electrically conductive material layer 46L.

Figure 11A:
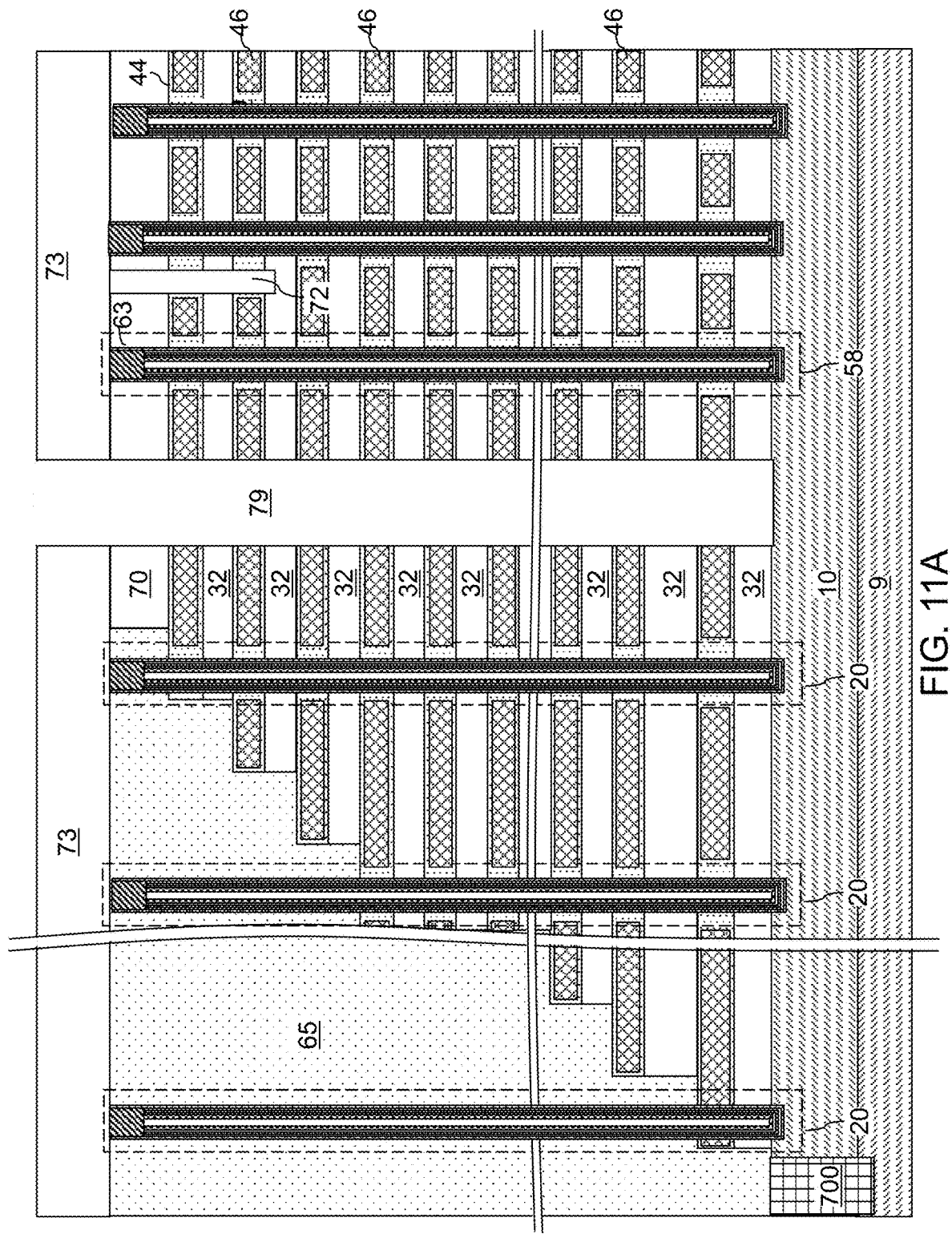
FIG. 11A is a schematic vertical cross-sectional view of the exemplary structure after removal of a deposited conductive material from within the backside trench according to an embodiment of the present disclosure.
Figure 11B:
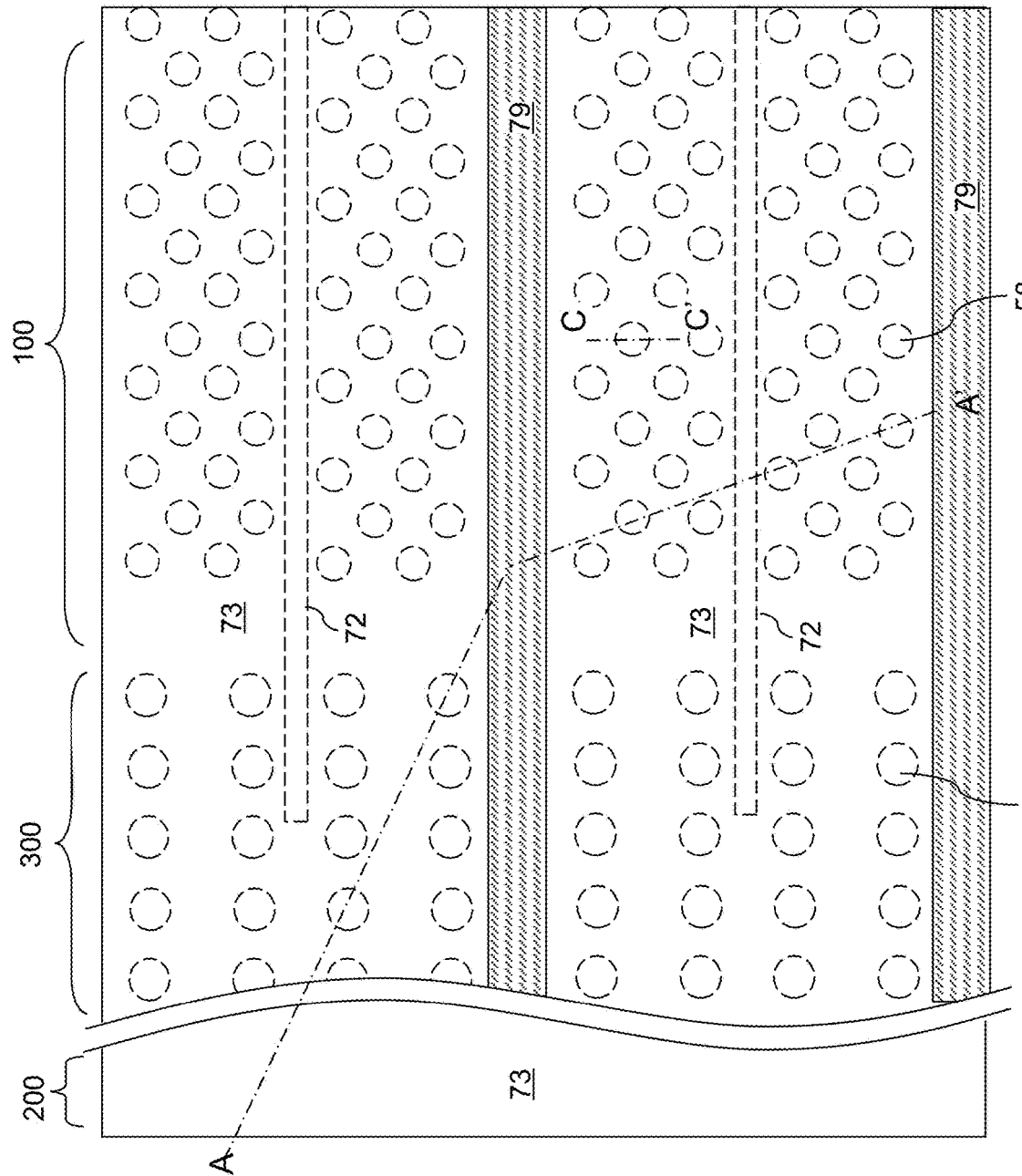
FIG. 11B is a partial see-through top-down view of the exemplary structure of FIG. 11A. The vertical plane A-A' is the plane of the schematic vertical cross-sectional view of FIG. 11A.
Figure 11C:
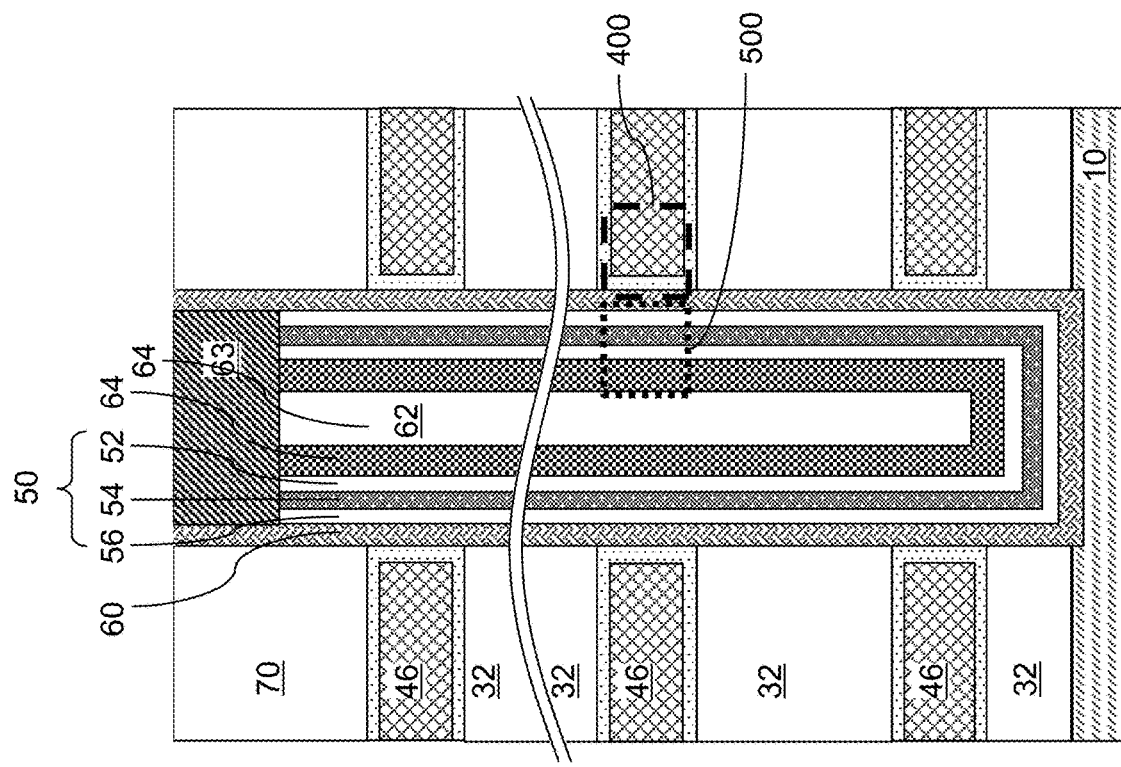
FIG. 11C is a vertical cross-sectional view of the exemplary structure in the first configuration along the vertical plane C-C' of FIG. 11B.

Referring to FIGS. 11A-11C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory opening fill structures 58. In other words, each electrically conductive layer 46 can be a word line that functions as a common control gate electrode for the plurality of vertical memory devices.

In one embodiment, the removal of the continuous electrically conductive material layer 46L can be selective to the material of the gate dielectric layer 44 if the gate dielectric layer is present in the backside trenches 79. In this case, a horizontal portion of the gate dielectric layer 44 can be present at the bottom of each backside trench 79. In another embodiment, the removal of the continuous electrically conductive material layer 46L may not be selective to the material of the gate dielectric layer 44 or, the gate dielectric layer 44 may not be present in the backside trench 79 (e.g., if the gate dielectric layer 44 portions are formed by oxidation of the outer surface of the vertical semiconductor channel 60). A backside cavity 79' is present within each backside trench 79.

As shown in FIG. 11C, each memory cell may comprise two virtual field effect transistors (400, 500) may be formed adjacent to each other at each horizontal level of the electrically conductive layer 46. A first MOS transistor 400 comprises a gate electrode (i.e., the electrically conductive layer) 46, a semiconductor channel (i.e., portion of the vertical semiconductor channel 60 at the horizontal level of the respective electrically conductive layer 46), and a gate dielectric layer 44 located between the gate electrode and the semiconductor channel. A second SONOS transistor 500 comprises a gate electrode (i.e., portion of the conductive core electrode 64 at the level of the respective electrically conductive layer 46), a semiconductor channel (i.e., portion of the vertical semiconductor channel 60 at the horizontal level of the respective electrically conductive layer 46), and a gate dielectric layer (i.e., portion of the memory film 50 at the horizontal level of the respective electrically conductive layer 46) located between the gate electrode and the semiconductor channel. The SONOS transistor 500 is a charge storage transistor because it includes the charge storage layer 54 in the memory film 50. In contrast, the MOS transistor 400 is not a charge storage transistor.

Figure 12D:
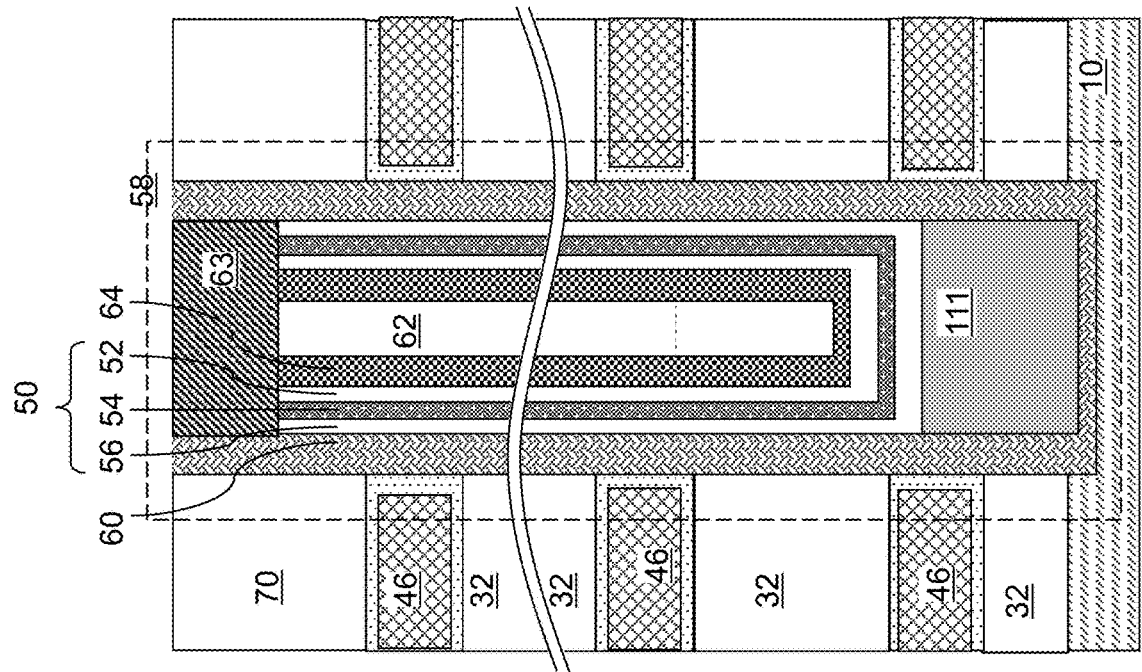
Figure 12C:
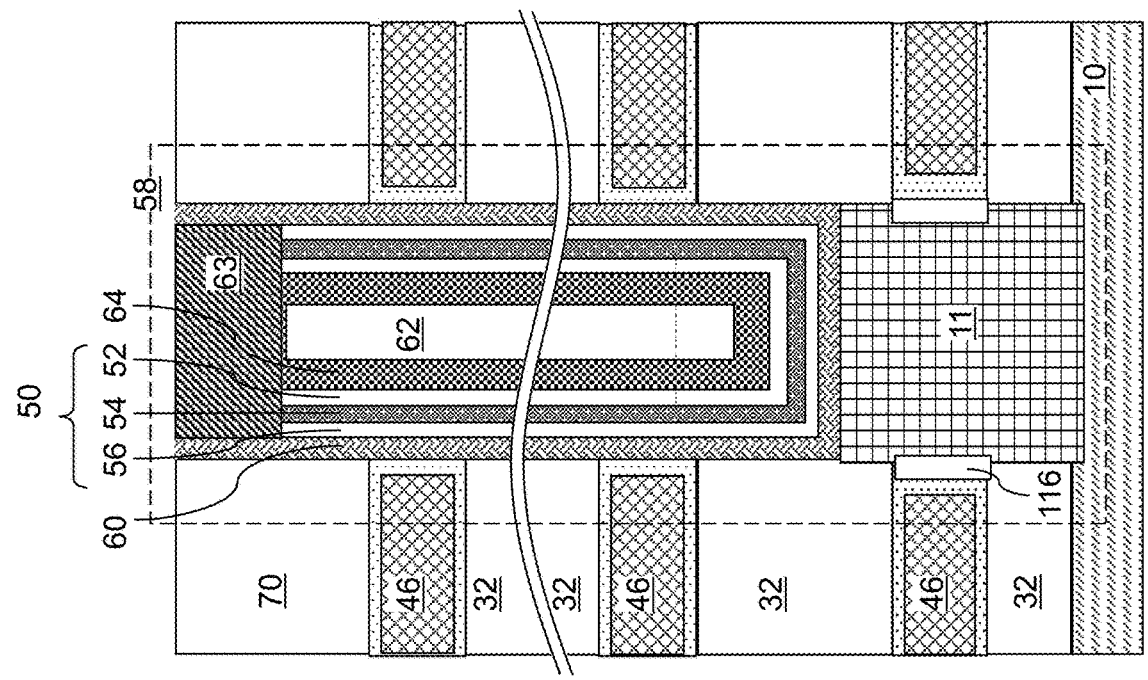
Figure 12E:
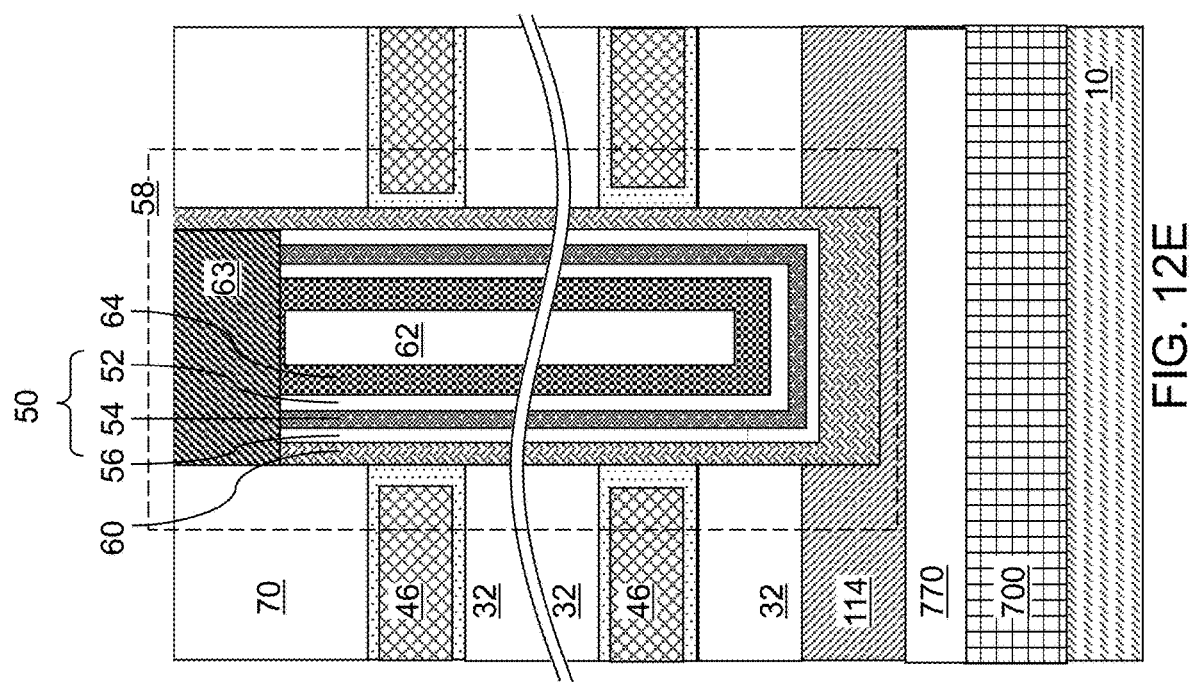

FIGS. 12A-12E illustrate alternative configurations of the memory opening fill structure 58 at the processing steps of FIGS. 11A-11C. Specifically, FIG. 12A corresponds to the configuration of FIG. 6A at the processing steps of FIGS. 11A-11C. FIG. 12B corresponds to the configuration of FIG. 6B at the processing steps of FIGS. 11A-11C. FIG. 12C corresponds to the configuration of FIG. 6C at the processing steps of FIGS. 11A-11C. FIG. 12D corresponds to the configuration of FIG. 6D at the processing steps of FIGS. 11A-11C. FIG. 12E corresponds to the configuration of FIG. 6E at the processing steps of FIGS. 11A-11C.

In the case of the configuration illustrated in FIG. 12C, a thermal oxidation process or a plasma oxidation process can be performed after the processing steps of FIG. 9 and prior to the processing steps of FIG. 10 to form a tubular dielectric spacer 116 on each physically exposed cylindrical sidewall of the pedestal channel portions 11. In the case of the configuration illustrated in FIG. 12E, an isotropic etchant that etches the material of the source-level sacrificial layer 47 selective to the other materials of the structure may be introduced into the backside trenches 79, and a source cavity can be formed in the volume from which the source-level sacrificial layer 47 is removed. A doped semiconductor material having a doping of the second conductivity type can be deposited in the source cavity to form a source layer 114, which can function as a common source region for the entire vertical NAND string that includes a respective vertical semiconductor channel 60. The source layer 114 is a semiconductor material layer that underlies the alternating stack (32, 46), and each of the vertical semiconductor channels 60 contacts, and is electrically connected to, the source layer 114.

Figure 13:
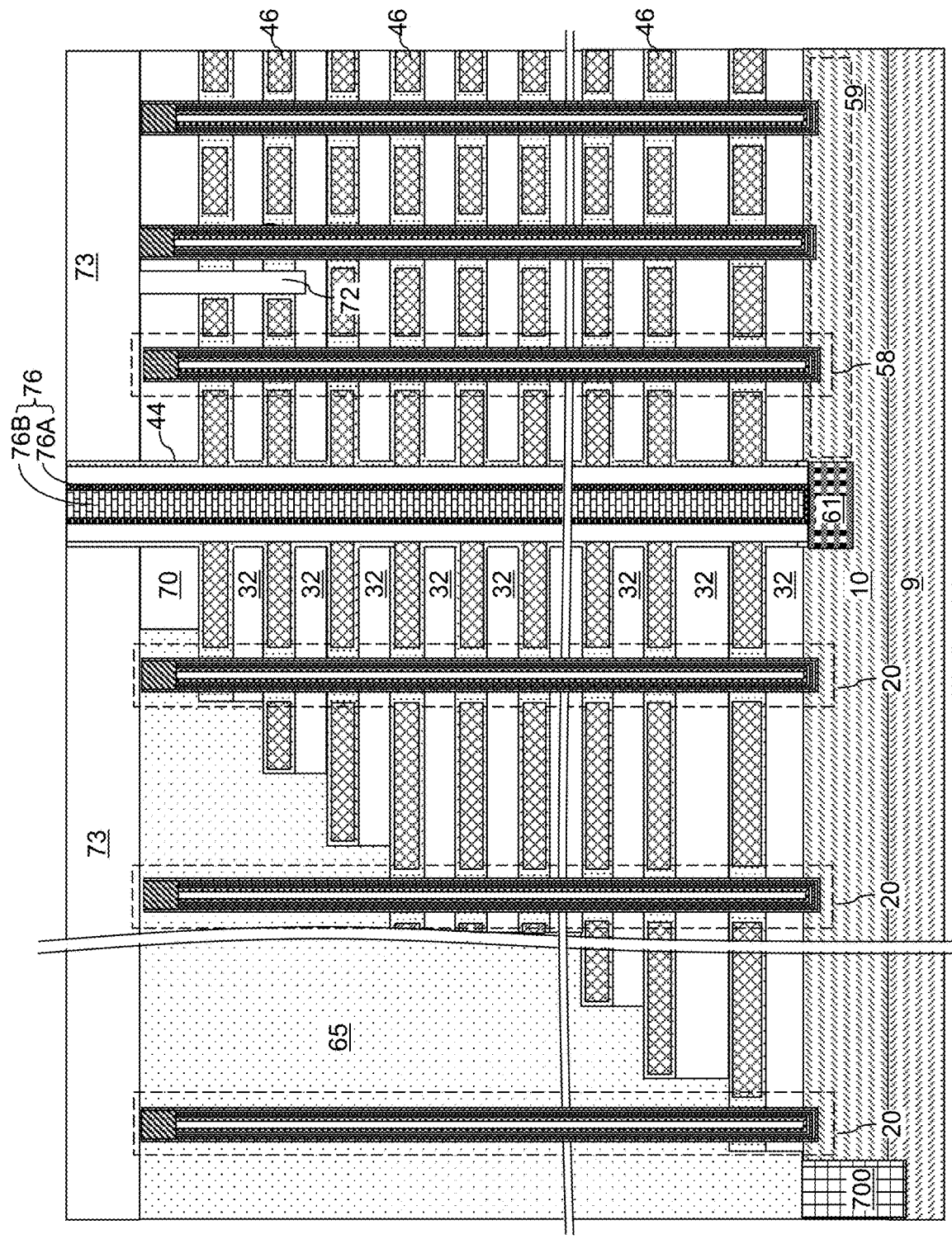
FIG. 13 is a schematic vertical cross-sectional view of the exemplary structure after formation of an insulating spacer and a backside contact structure according to an embodiment of the present disclosure.

Referring to FIG. 13, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a gate dielectric layer 44 is present, the insulating material layer can be formed directly on surfaces of the gate dielectric layer 44 and directly on the sidewalls of the electrically conductive layers 46. If a gate dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

In some embodiments, a source region 61 may optionally be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. Semiconductor channels (59, 11, 60) extend between each source region 61 and a respective set of drain regions 63. The semiconductor channels (59, 11, 60) include the vertical semiconductor channels 60 of the memory opening fill structures 58. However, in the CUA embodiment illustrated in FIG. 12E, the source region 61 and the horizontal semiconductor channel 59 may be omitted and replaced with the source layer 114.

One or more bottommost electrically conductive layers 46 provided upon formation of the electrically conductive layers 46 within the alternating stack (32, 46) can comprise select gate electrode(s) (SGS, SGSA) for source side select transistor(s) for each vertical NAND string. One or more topmost electrically conductive layers 46 provided upon formation of the electrically conductive layers 46 within the alternating stack (32, 46) can comprise select gate electrode (s) (SGD, SGDA) for drain side select transistor(s) for each vertical NAND string, as will be described in more detail below with respect to FIGS. 16A-16D.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61 in some embodiments. In the CUA configuration illustrated in FIG. 12E, the backside contact via structure 76 may be omitted and the entire backside trench 79 may be filled with the dielectric material.

Figure 14A:
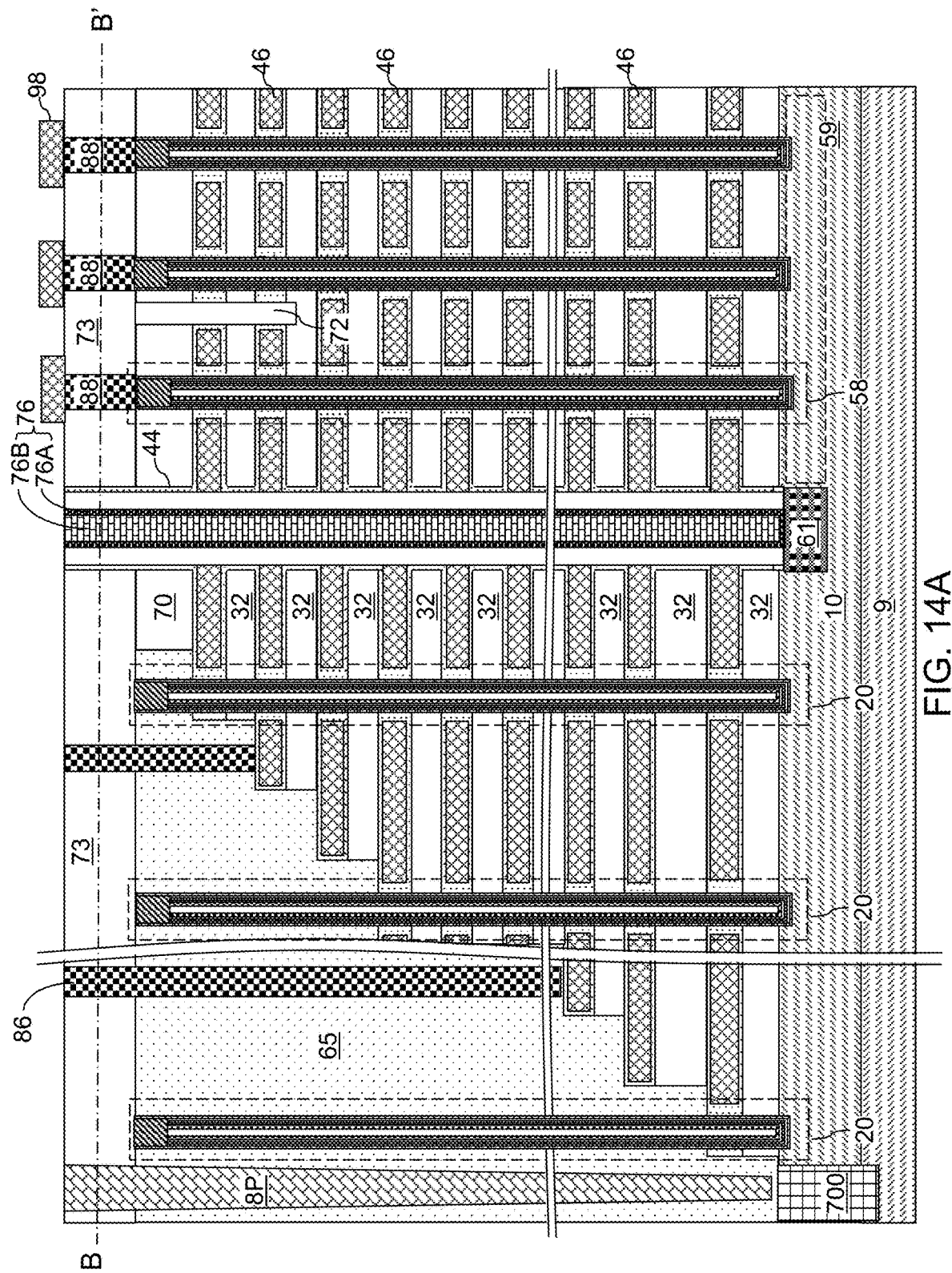
FIG. 14A is a schematic vertical cross-sectional view of the exemplary structure after formation of additional contact via structures according to an embodiment of the present disclosure.
Figure 14B:
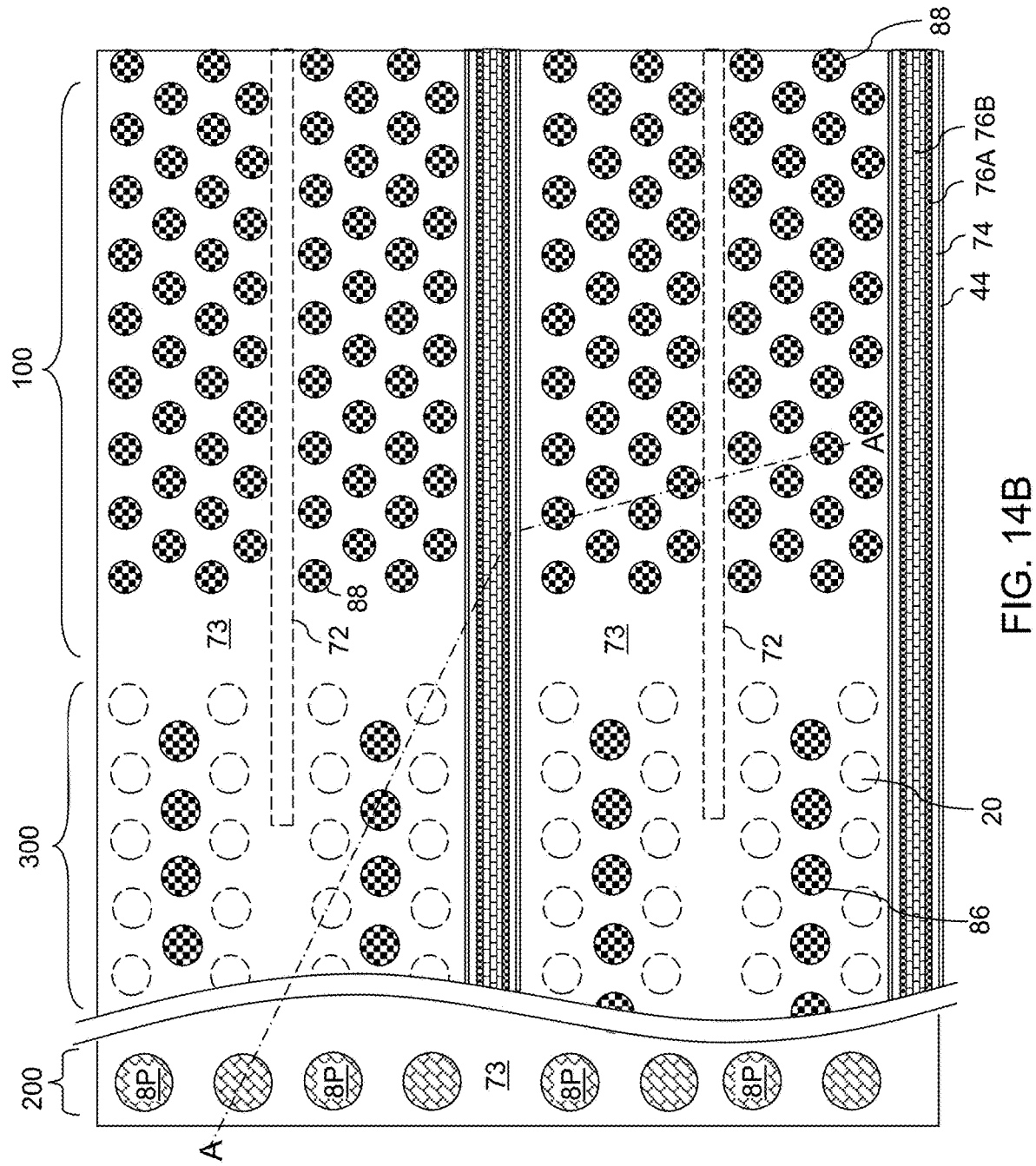
FIG. 14B is a horizontal cross-sectional view of the exemplary structure of FIG. 14A across the vertical plane B-B'. The vertical plane A-A' is the plane of the schematic vertical cross-sectional view of FIG. 14A.

Referring to FIGS. 14A and 14B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Optional peripheral device contact via structures 8P can be formed through the retro-stepped dielectric material portion 65 directly on respective nodes of the peripheral devices 700 if the peripheral devices 700 are located in the peripheral region 200. Bit lines 98 are formed in electrical contact with the drain contact via structures 88. The bit lines 98 are electrically connected to the drain regions 63 and the conductive core electrodes 64 via the respective drain contact via structures 88.

Referring to FIGS. 15A and 15B, band diagrams for exemplary layer stacks are illustrated, which can be employed in a memory opening fill structure 58. In the first exemplary layer stack illustrated in FIG. 15A, the first tunneling dielectric layer 56 comprises a hole tunneling layer which consists of a first silicon oxide layer, and the second tunneling dielectric layer 52 comprises an electron tunneling layer which consists of a second silicon oxide layer. In the second exemplary layer stack illustrated in FIG. 15B, the first tunneling dielectric layer 56 comprises a hole tunneling layer which includes a stack of a silicon oxide layer, a silicon nitride layer, and an aluminum oxide layer, and the second tunneling dielectric layer 52 comprises an electron tunneling layer which consists of an aluminum oxide layer. The gate dielectric layer 44 consists of aluminum oxide layer, the charge storage layer 54 consists of silicon nitride, the vertical semiconductor channel 60 consists of p-type doped silicon or undoped silicon, and the conductive core electrode 64 consists of heavily n-type doped (e.g., phosphorus doped) silicon in both exemplary stacks.

Figure 16A:
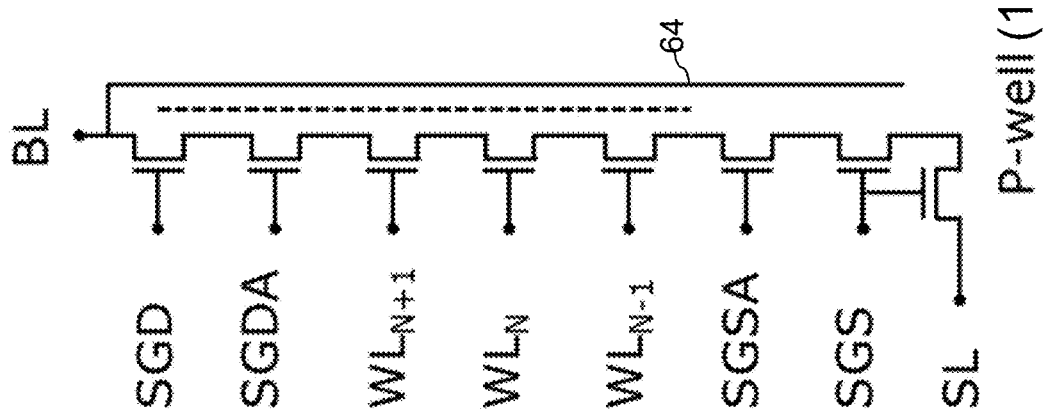
FIG. 16A is circuit diagram for a NAND string according to an embodiment of the present disclosure.

FIG. 16A is circuit diagram for a NAND string according to an embodiment of the present disclosure in which the first conductivity type is p-type. The circuit diagram corresponds to the configuration illustrated in FIG. 12C. A source-side select gate electrode SGS may comprise the bottommost electrically conductive layer 46 of the exemplary structure. The p-well may comprise the semiconductor material layer 10. The source line SL may comprise the source region 61 connected to the backside contact via structure 76. Drain-side select gate electrode(s) SGD may comprise the topmost electrically conductive layer(s) 46 that are laterally spaced apart by drain-select-region isolation structures 72. Additional source-side select gate electrodes SGSA may be provided above the respective source-side select gate electrodes SGS. Additional drain-side select gate electrodes SGDA may be provided below the respective drain-side select gate electrodes SGD. Word lines ($W_{N-1}$, $W_N$, $W_{N+1}$, etc.) may comprise a subset of the electrically conductive layers 46 provided between the source-side select gate electrodes (SGS, SGSA) and the drain-side select gate electrodes (SGD, SGDA). A bit line BL (e.g., element 98 in FIG. 14A) is electrically connected to a drain region 63, which is located at a top end of a vertical semiconductor channel 60 and to the top of the conductive core electrode 64, which functions as a back gate for the vertical semiconductor channel 60. Electrical current through the vertical semiconductor channel 60 is controlled by the source-side select gate electrodes (SGS, SGSA), the word lines ($W_{N-1}$, $W_N$, $W_{N+1}$, etc.), and the drain-side select gate electrodes (SGD, SGDA). CPwell refers to a p-type doped semiconductor well (e.g., semiconductor material layer 10) in the substrate 9.

Figure 16B:
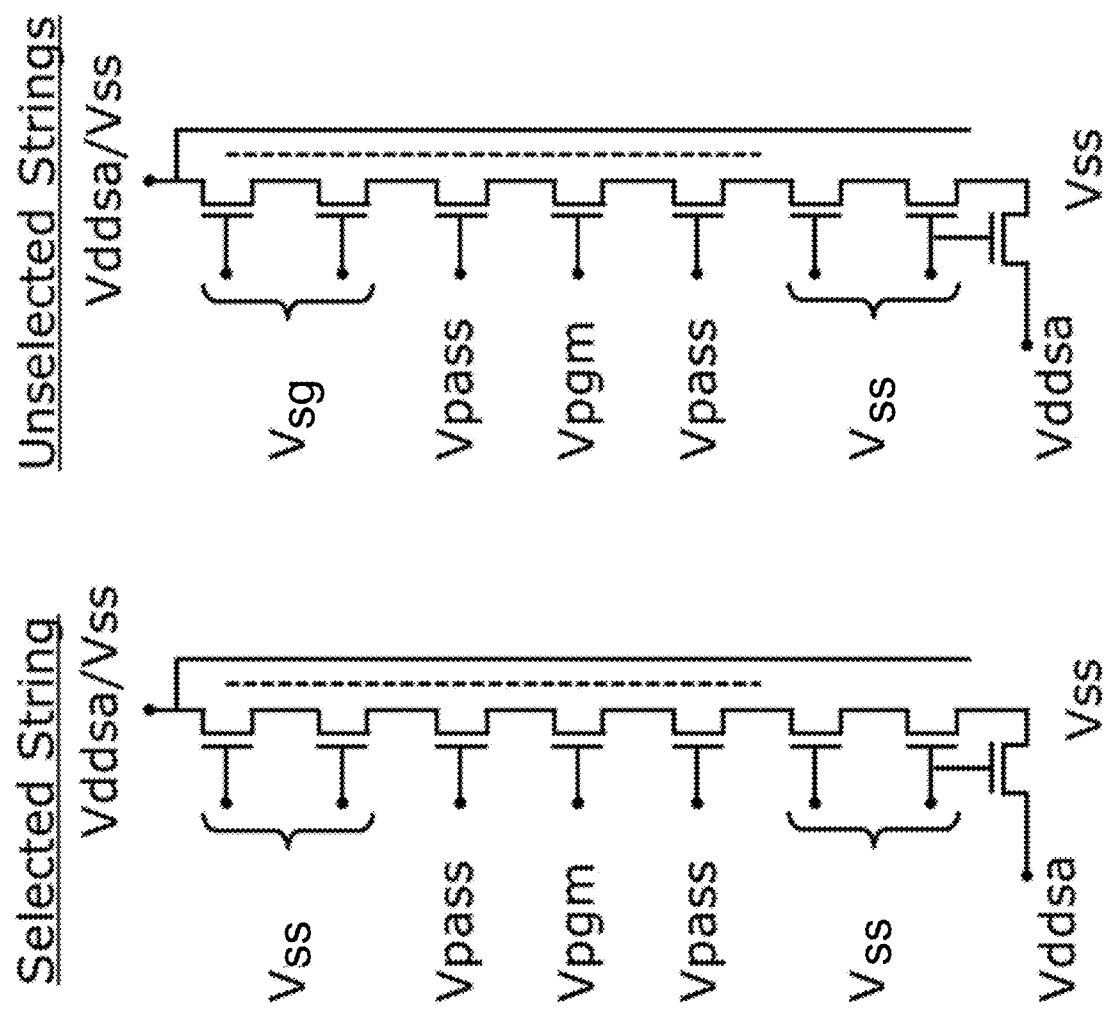
FIG. 16B illustrates circuit diagrams for a selected NAND string and for an unselected NAND string during a programming operation according to an embodiment of the present disclosure.

FIG. 16B illustrates circuit diagrams for a selected NAND string and for an unselected NAND string during a programming operation according to an embodiment of the present disclosure. The source-side select gate electrodes (SGS, SGSA) are biased at a selected gate bias voltage Vss, while the source line and bit line are biased at Vss followed by being biased at a higher drain programming voltage Vddsa. Thus, the selected vertical semiconductor channel 60 is boosted and floating during the programming step, while the unselected channels are boosted slightly to avoid breaking down the gate dielectric layer 44 during the application of the programming voltage Vpgm to the selected word line 46. The selected drain-side select gate electrodes (SGD, SGDA) are biased at the selected gate bias Vss, while unselected drain-side select gate electrodes (SGD, SGDA) are biased at an unselected gate bias voltage Vsg. The word line controlling the selected memory element to be programmed is biased at a programming voltage Vpgm, and word lines controlling unselected memory elements are biased at a pass gate voltage.

Figure 16C:
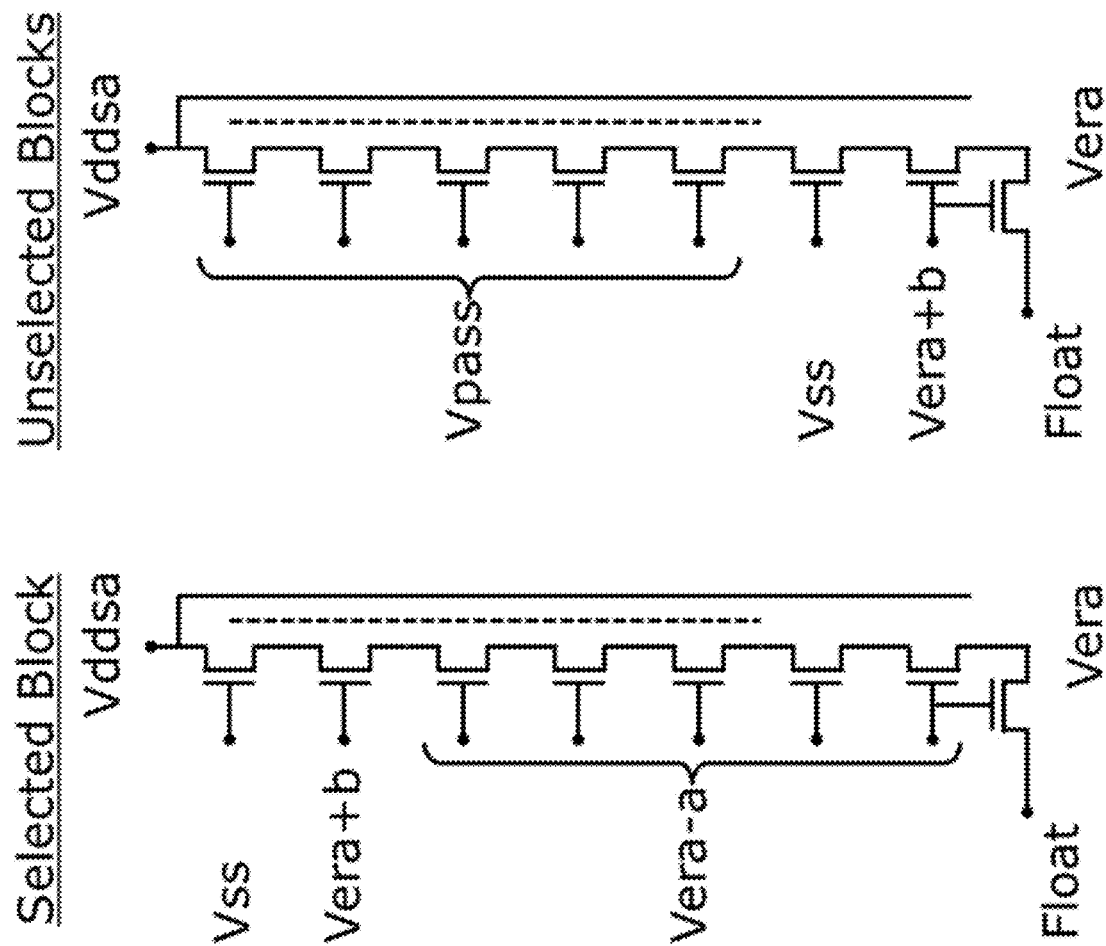
FIG. 16C illustrates circuit diagrams for a selected NAND string and for an unselected NAND string during an erase operation according to an embodiment of the present disclosure.

FIG. 16C illustrates circuit diagrams for a selected NAND block and for an unselected NAND block during an erase operation according to an embodiment of the present disclosure. Various voltages can be applied as illustrated. Vera refers to an erase voltage, and a and b refer to respective voltage offsets (that are positive) that can be selected for optimized circuit operation. The selected block can be erased, while the memory cells in the unselected block are not affected. A memory block may include all memory opening fill structures 58 located between two adjacent backside trenches 79.

Figure 16D:
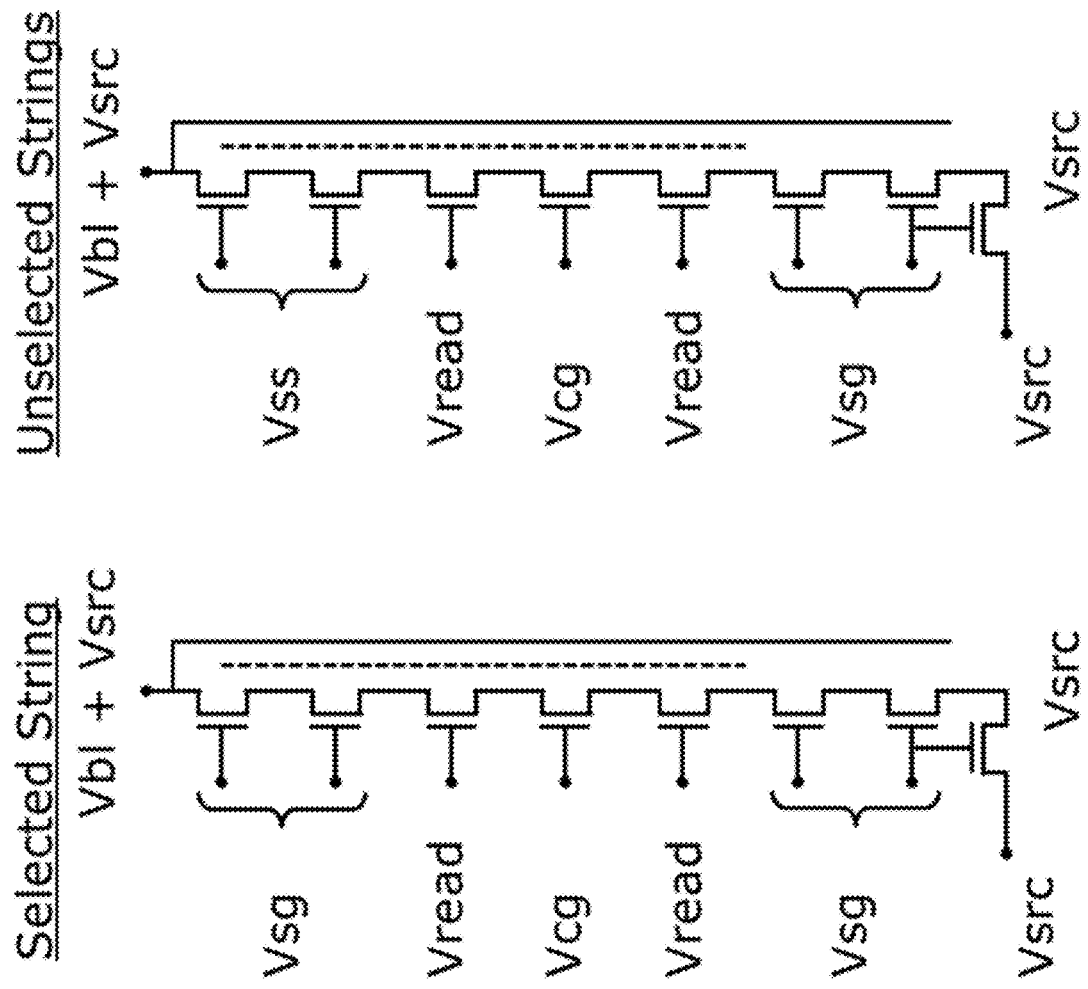
FIG. 16D illustrates circuit diagrams for a selected NAND string and for an unselected NAND string during a read operation according to an embodiment of the present disclosure.

FIG. 16D illustrates circuit diagrams for a selected NAND string and for an unselected NAND string during a read operation according to an embodiment of the present disclosure. Various voltages can be applied as illustrated. Vsrc refers to a source voltage for a read operation. Vread refers to an unselected word line read bias voltage applied to all unselected word lines. Vcg refers to a selected word line read bias voltage applied to the selected word line. Vbl refers to a bit line offset voltage. The voltage applied to the bit lines can be Vbl+Vsrc.

Figure 17A:
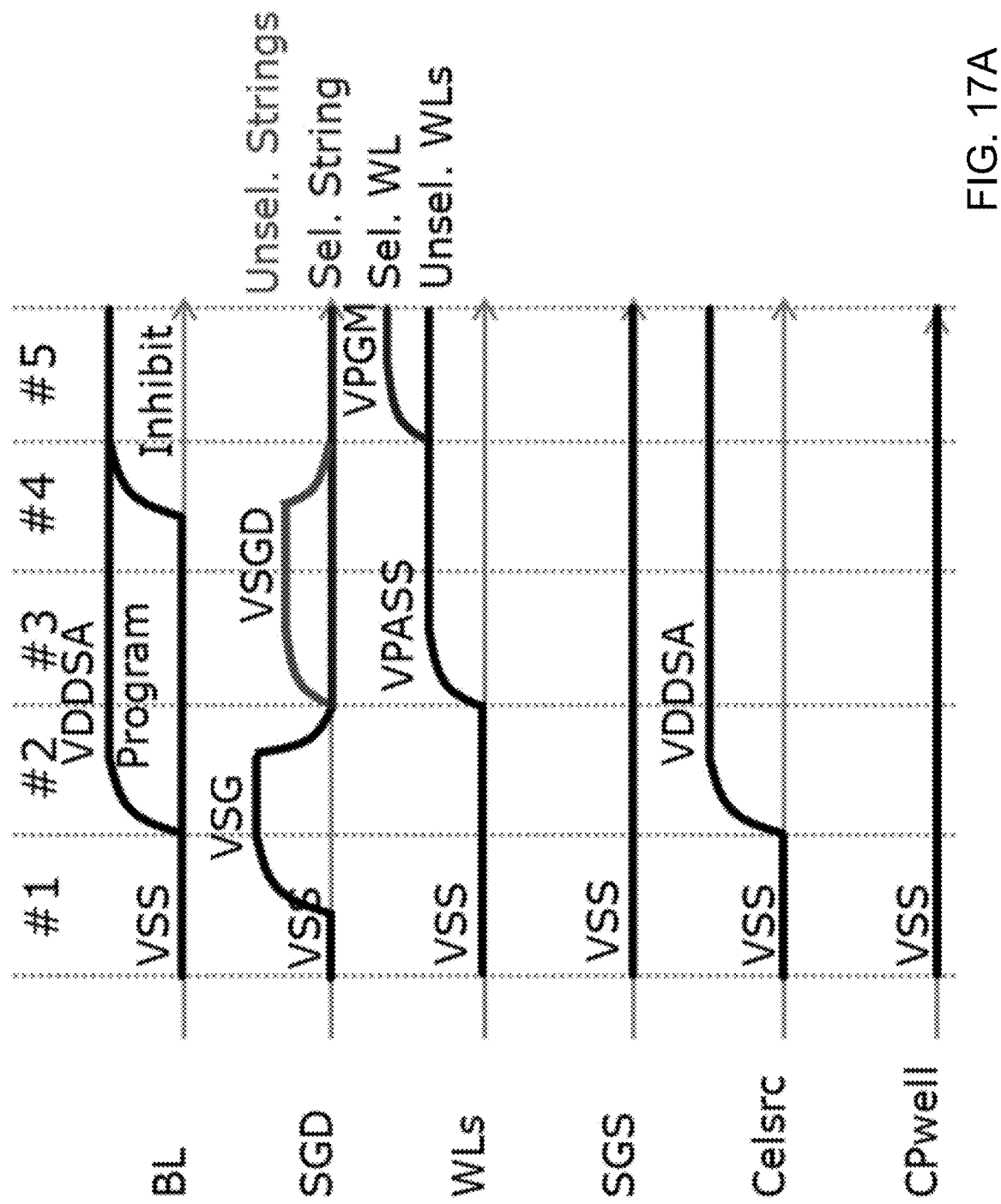
FIG. 17A illustrates a timing chart during a programming operation.

FIG. 17A illustrates a timing chart during the programming operation of FIG. 16B. Celsrc refers to the voltage applied to the source line. Selected gate bias Vss is applied to all nodes of the selected and unselected NAND strings in step 1.

In step 2, the voltage applied to the source line and to the bit line of the selected NAND string is increased to Vddsa and voltage applied to SGD of the selected NAND strings is increased to Vsg.

In step 3, the voltage applied to SGD of the selected NAND string is decreased back to Vss, while the voltage applied to SGD of the unselected NAND string is increased to Vsgd, which is less than Vsg. The voltage applied to all word lines is increased to Vpass.

In step 4, the voltage applied to the bit line of the unselected NAND string is increased to Vddsa, while the voltage applied to SGD of the unselected NAND string is decreased to Vss. Thus, voltages applied to the drain-side select gate electrodes differ in steps 3 and 4 depending on whether their respective NAND string is selected or not. Likewise, voltages applied to the bit lines differ depending on whether each bit line is connected to a selected NAND string or connected to an unselected NAND string.

In step 5, the voltage applied to the selected word line is increased from Vpass to Vpgm. Thus, voltages applied to the word lines in step 5 differ depending on whether each word line is selected or not. Boosted (floating) channels are programmed according to an embodiment of the present disclosure. Inhibit channels are boosted only slightly in order to avoid breakdown of the gate dielectric layer 44 because the thickness of the gate dielectric layer 44 may not be sufficiently thick to bear the high programming voltage Vpgm.

Figure 17B:
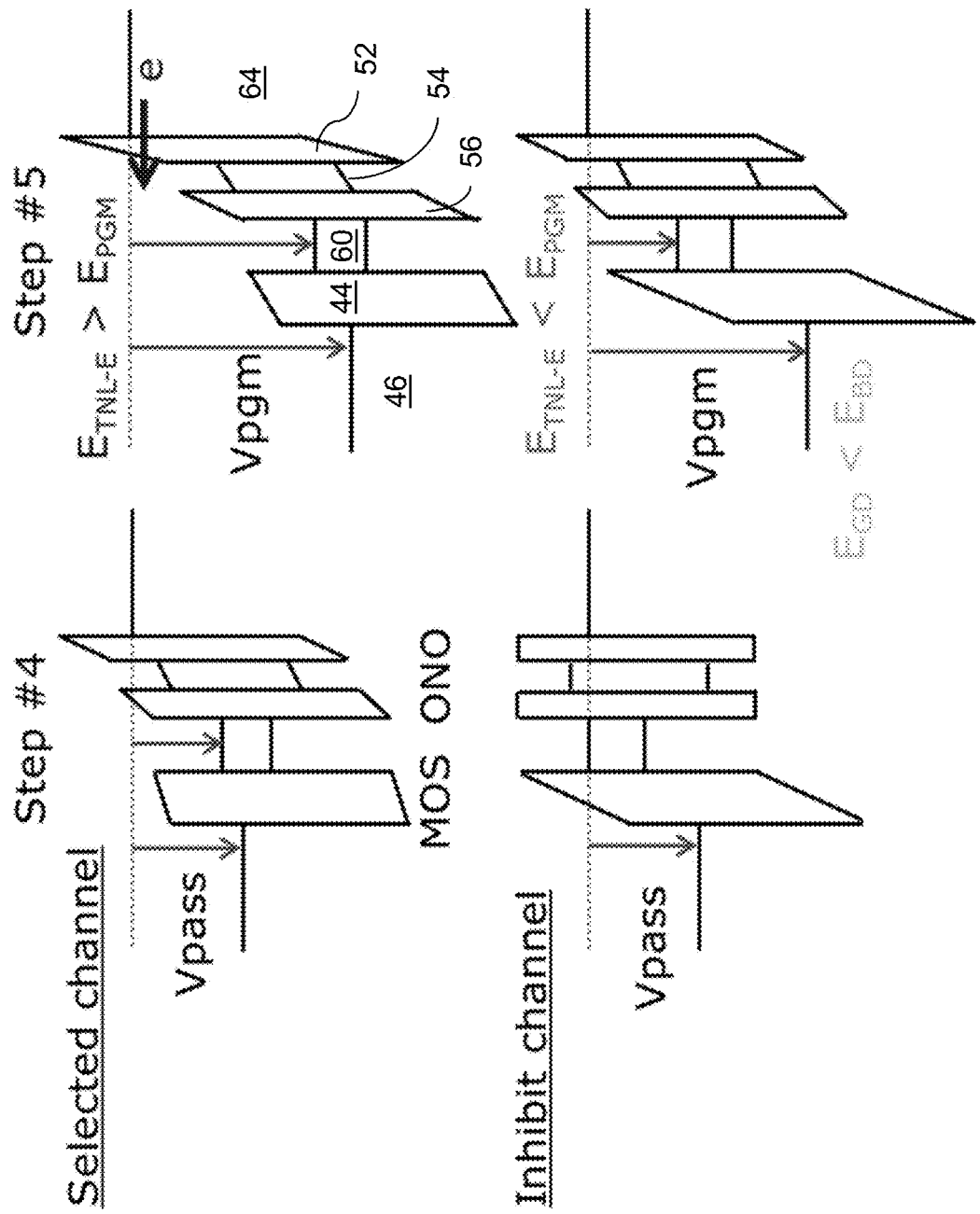
FIG. 17B illustrates bands diagram during fourth and fifth steps of the programming operation for selected and unselected memory cells.

FIG. 17B illustrates the band diagram for a selected channel and an inhibited channel during fourth and fifth steps of the programming operation. In the inhibited cells, electrical fields in the gate dielectric layer 44 and the second tunneling dielectric layer 52 are less than the breakdown field and the programming field, respectively. This condition can be achieved by optimizing the magnitude of the pass gate voltage Vpass. As shown in the top right of FIG. 17B, electrons tunnel from the conductive core electrode 64 through the second tunneling dielectric layer 52 into the charge storage layer 54 during programming.

Figure 18A:
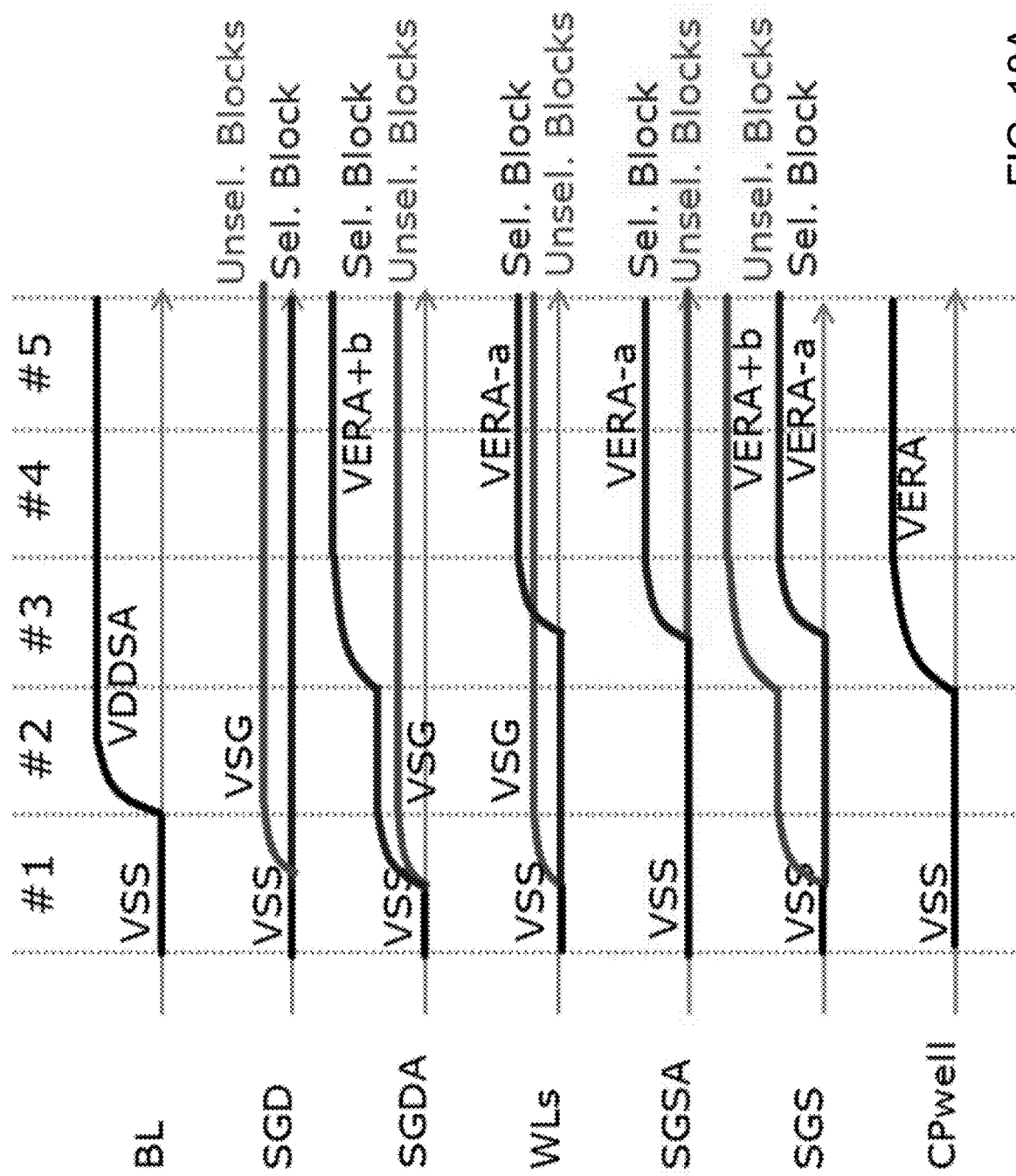
FIG. 18A illustrates a timing chart during an erase operation.

FIG. 18A illustrates a timing chart during the five steps of the erase operation for selected and unselected memory blocks. In case the first conductivity type is p-type, holes for erase are supplied from the p-type well 10 (i.e., CPwell) and/or from the source line (if the source line includes a p-type semiconductor material) while the bit line voltage remains at zero for the cell erase operation. The holes flow through the vertical semiconductor channel 60 and tunnel through the first tunneling dielectric 56 from the vertical semiconductor channel 60 to the charge storage layer 54 to erase the charge stored in the charge storage layer 54 (e.g., by recombining with/de-trapping the electrons stored in the charge storage layer 54, which may optionally store excess holes after the erase step).

Figure 18B:
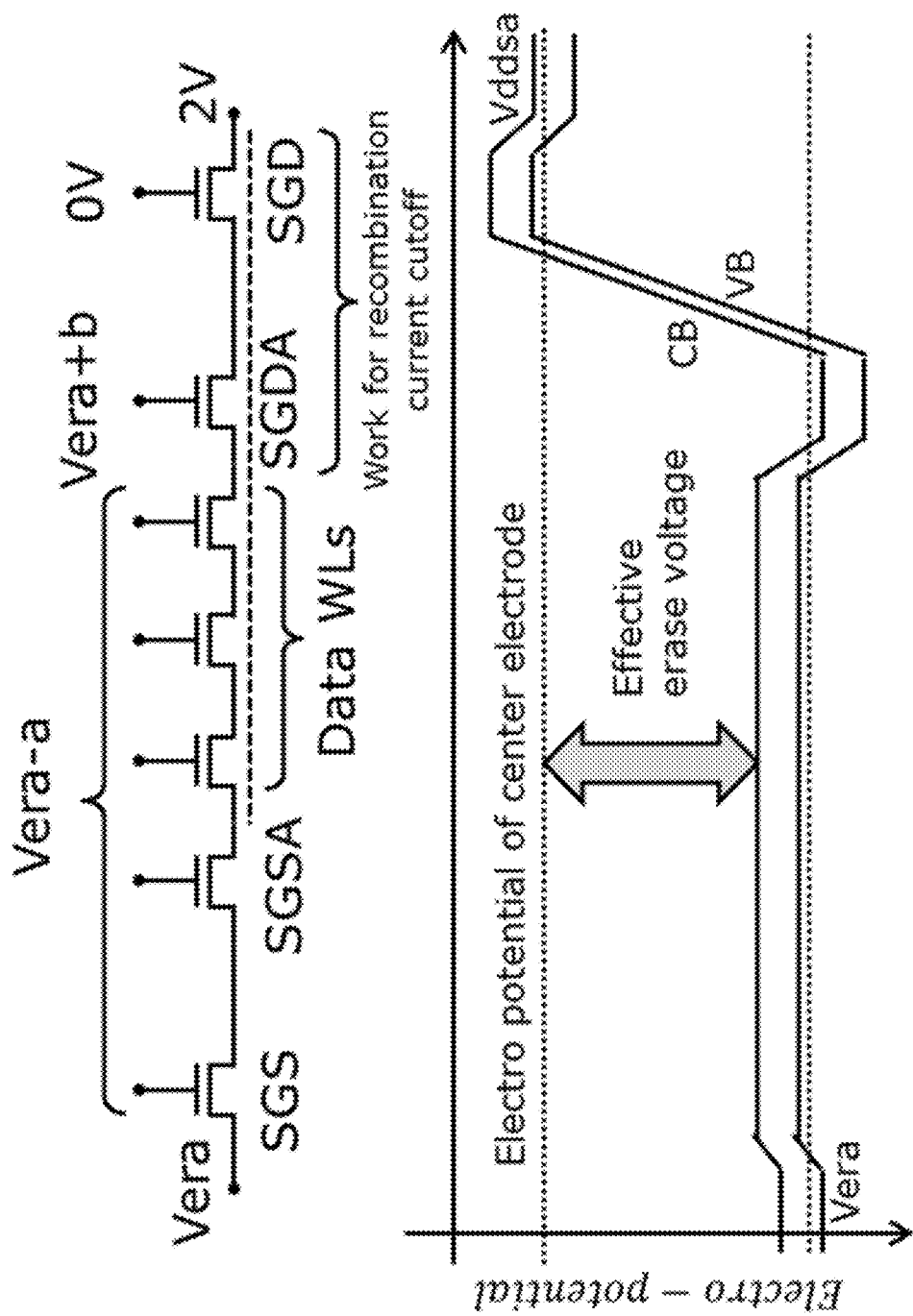
FIG. 18B illustrates a schematic channel potential in a vertical semiconductor channel of a selected NAND string during the erase operation.
Figure 18C:
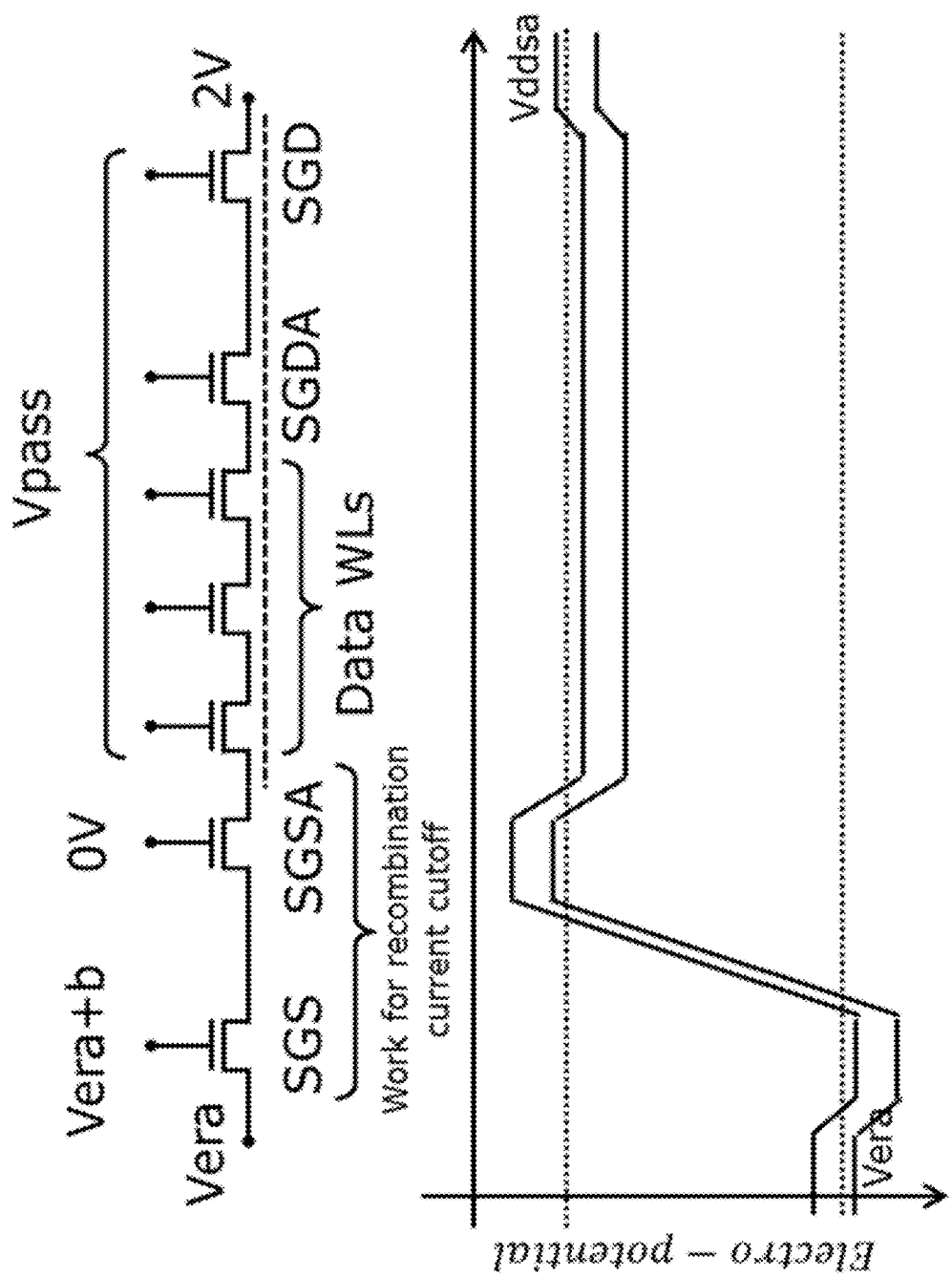
FIG. 18C illustrates a schematic channel potential in a vertical semiconductor channel of an unselected NAND string during the erase operation.

If the drain-side select gate electrode is biased as illustrated and if the bit line is biased at 0 V, recombination current flows from the source line to the bit line. The additional drain-side select gate electrode SGDA and the additional source-side select gate electrode SGSA can be used to cut off the recombination current as shown in FIGS. 18B and 18C. The space between SGD(SGS) and SGDA (SGSA) can be tuned to avoid gate-induced drain leakage (GIDL) current. Alternatively, dummy word lines may be arranged instead of employing this space.

FIG. 18B illustrates a schematic channel potential in a vertical semiconductor channel of a selected NAND block during the erase operation and the effective erase voltage. The "center electrode" refers to an embodiment of the conductive core electrode 64 which is located in the center of the memory opening 49. FIG. 18C illustrates a schematic channel potential in a vertical semiconductor channel of an unselected NAND block during the erase operation. The holes from the CPwell are used for the erase operation. Biasing of the SGDA and SGS electrodes as shown in FIG. 18A is used to prevent the hole current through the vertical semiconductor channel 60.

Figure 19A:
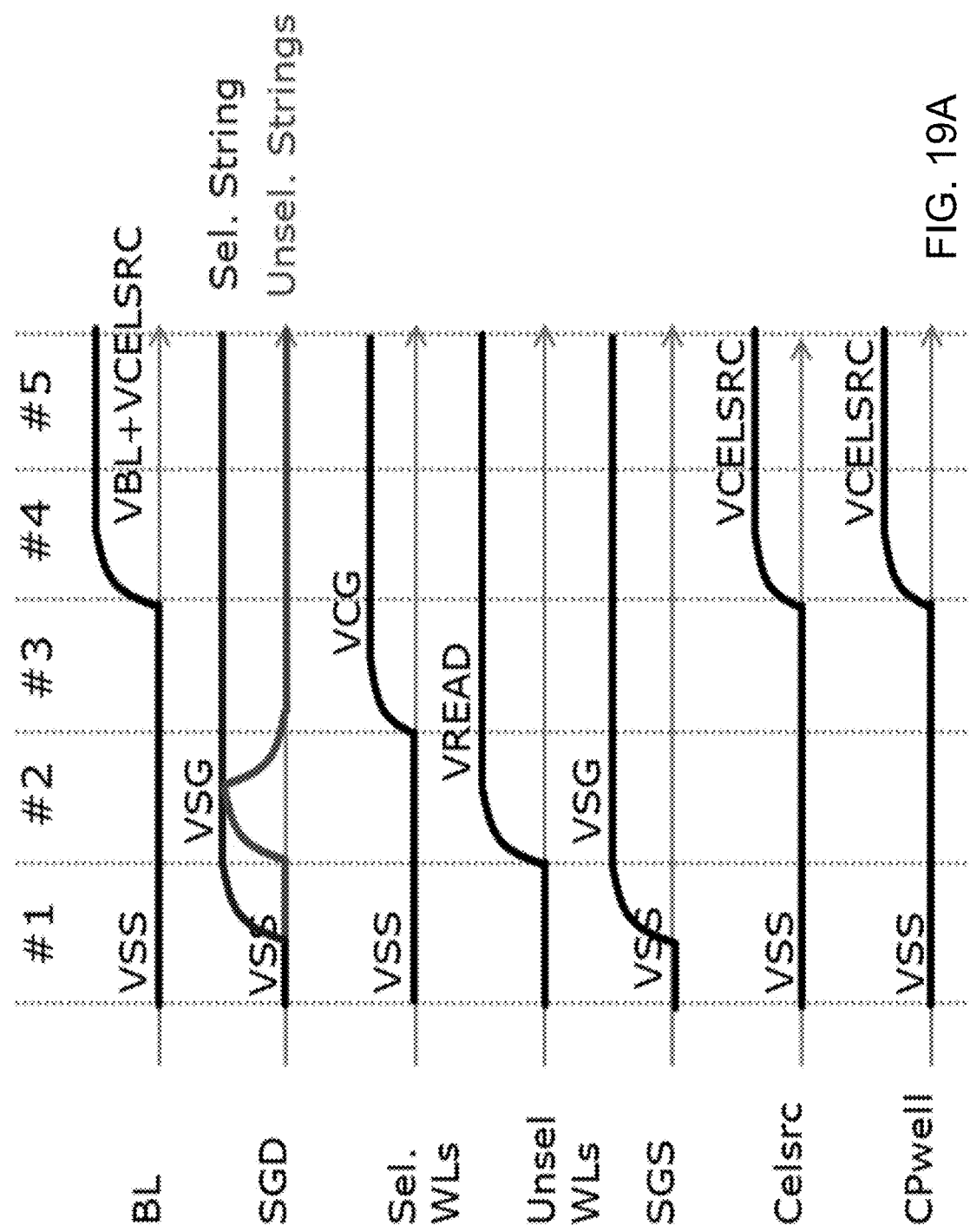
FIG. 19A illustrates a timing chart during a read operation.

FIG. 19A illustrates a timing chart during a read operation. Read bias condition may be the same as a conventional condition. The application of voltage Vsg to SGD of unselected NAND strings ("Vsg spike") at step 2 is used to prevent or decrease hot carrier injection on boosted channels of the unselected NAND strings.

Figure 19B:
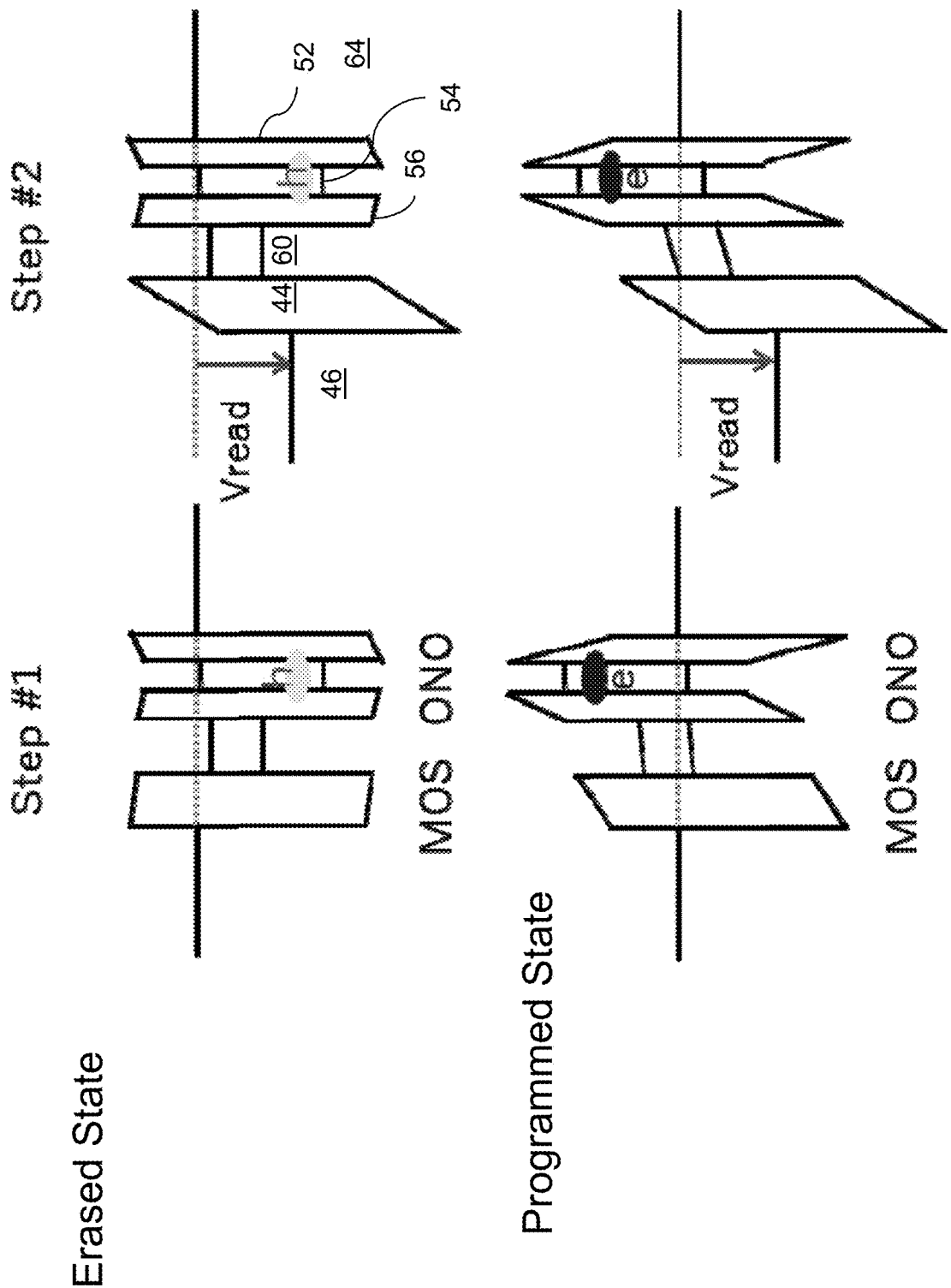
FIG. 19B illustrates a band diagram during first and second steps of the read operation for erased and programmed memory cells.

FIG. 19B illustrates the band diagram for a selected memory cell during first and second steps of the read operation when the memory cell is in the erased state (top part) and in the programmed state (bottom part). The charge storage layer 54 may store (i.e., trap) holes in the erased state and may store (e.g., trap) electrons in the programmed state. Read disturb stress is negligibly small for both erased and programmed states because the electrical field induced by the applied read bias voltage Vread is shielded by the vertical semiconductor channel 60 that remains conducting during the read operation.

FIG. 20 is a table illustrating exemplary voltages that may applied during the programming, erasing and reading of the devices of FIGS. 16A-16D. The voltages are exemplary and should not be considered limiting on the scope of the claims.

Referring to all drawings and according to various embodiments of the present disclosure, a three-dimensional memory device is provided, which comprises: an alternating stack of insulating layers 32 and electrically conductive layers 46 located over a substrate 9, memory openings 49 extending through the alternating stack (32, 46), and memory opening fill structures 58 located within a respective one of the memory openings 49, and a gate dielectric 44 located between the memory opening fill structures 58 and the electrically conductive layers 46. Each of the memory opening fill structures 58 comprises a vertical semiconductor channel 60, a conductive core electrode 64 and a memory film 50 located between the vertical semiconductor channel and the conductive core electrode. The memory film 50 comprises a layer stack including a first tunneling dielectric 56 contacting the vertical semiconductor channel 60, a second tunneling dielectric layer 52 contacting the conductive core electrode 64, and a charge storage layer 54 located between the first tunneling dielectric and the second tunneling dielectric.

In one embodiment, the three-dimensional memory device is configured to be programmed by injecting electrons from the conductive core electrode 64 through the second tunneling dielectric 52 into the charge storage layer 54, and the three-dimensional memory device is configured to be erased by injecting holes from vertical semiconductor channel 60 through the first tunneling dielectric 56 into the charge storage layer 54. The electrically conductive layers 46 comprise word lines and the three-dimensional memory device comprises NAND memory device.

In one embodiment, the charge storage layer 54 comprises a silicon nitride layer and the gate dielectric 44 comprises aluminum oxide. In one embodiment, the first tunneling dielectric layer 56 comprises a first silicon oxide layer; and the second tunneling dielectric layer 52 comprises a second silicon oxide layer. In another embodiment, the first tunneling dielectric layer 56 comprises a stack of a silicon oxide layer, a silicon nitride layer, and an aluminum oxide layer; and the second tunneling dielectric layer 52 comprises an aluminum oxide layer.

In one embodiment, each of the vertical semiconductor channels 60 comprises a semiconductor material having a doping of a first conductivity type, and each of the memory opening fill structures 58 comprises a drain region 63 contacting a top end of a respective vertical semiconductor channel 60 and having a doping of a second conductivity type that is the opposite of the first conductivity type. In one embodiment, the conductive core electrode 64 comprises a doped semiconductor material of the second conductivity type, and the drain region 63 contacts a top end of a respective conductive core electrode 64, a respective first tunneling dielectric 56, a respective charge storage layer 54, and a respective second tunneling dielectric 52.

In one embodiment, the alternating stack (32, 46) is located over a semiconductor material layer 10 of a first conductivity type containing a source region 61 of a second conductivity type.

In one embodiment, each of the vertical semiconductor channels 60 contacts a top surface of the semiconductor material layer 10. In another embodiment, each of the memory opening fill structures 58 further comprises a pedestal channel portion 11 contacting a top surface of the semiconductor material layer 10 and bottom surfaces of a respective vertical semiconductor channel 60. In yet another embodiment, each of the memory opening fill structures 58 further comprises an insulating spacer 111 located over a horizontal bottom surface of the vertical semiconductor channel 60 and under a bottom horizontal surface of the memory film 50.

In one embodiment, each of the memory opening fill structures 58 comprises a dielectric core 60 that is laterally surrounded by the conductive core electrode 64, and a drain region 63 contacting a top surface of the dielectric core 62. In another embodiment, an air gap 69 is located in the dielectric core 62.

In one embodiment, portion of an outer sidewall of the vertical semiconductor channel 60 contacts a source layer 104, and the source layer is located over peripheral devices 700.

In one embodiment, the memory openings 49 comprise a two-dimensional array of discrete memory openings that are laterally spaced apart from each other, and each of the vertical semiconductor channel 60, the first tunneling dielectric 56, the charge storage layer 54, and the second tunneling dielectric 52 has a respective tubular horizontal cross-sectional shape.

In one embodiment, the first tunneling dielectric 56 contacts an inner sidewall of the vertical semiconductor channel 60; the charge storage layer 54 contacts an inner sidewall of the first tunneling dielectric 56; the second tunneling dielectric 52 contacts an inner sidewall of the charge storage layer 54; and the conductive core electrode 64 contacts an inner sidewall of the second tunneling dielectric 52.

Embodiments of the present disclosure provide a NAND memory string employing two tunneling dielectrics. The first tunneling dielectric 56 can be employed for tunneling of charge carriers of the first conductivity type, and the second tunneling dielectric 52 can be employed for tunneling of charge carriers of the second conductivity type. Tunneling of charge carrier of the second conductivity type from the conductive core electrode 64 through the second tunneling dielectric 52 into the charge storage layer 54 can be employed for a programming operation. Tunneling of charge carriers of the first conductivity type from the vertical semiconductor channel 60 through the first tunneling dielectric 56 into the charge storage layer 54 can be employed for an erase operation. Thus, the NAND string of the embodiment of the present disclosure can provide efficient tunneling of two types of charge carriers for a programming operation and for an erase operation. Additional non-limiting advantages include reduction of effective oxide thickness between the word line and the channel is reduced, which suppresses short channel effects (SCE). As a result, more ON-pitch scaling becomes acceptable. Furthermore, complex anisotropic etch of the bottom of the memory film to connect the vertical and horizontal semiconductor channels is not necessary since the channel is located outside the memory film. Finally, read disturb immunity is significantly improved.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers located over a substrate;
    memory openings extending through the alternating stack;
    memory opening fill structures located within a respective one of the memory openings; and
    a gate dielectric located between the memory opening fill structures and the electrically conductive layers,
    wherein:
    each of the memory opening fill structures comprises a vertical semiconductor channel, a conductive core electrode, and a memory film located between the vertical semiconductor channel and the conductive core electrode; and
    the memory film comprises a layer stack including a first tunneling dielectric contacting the vertical semiconductor channel, a second tunneling dielectric contacting the conductive core electrode, and a charge storage layer located between the first tunneling dielectric and the second tunneling dielectric.

2. The three-dimensional memory device of claim 1, wherein:
    the three-dimensional memory device is configured to be programmed by injecting electrons from the conductive core electrode through the second tunneling dielectric into the charge storage layer; and
    the three-dimensional memory device is configured to be erased by injecting holes from vertical semiconductor channel through the first tunneling dielectric into the charge storage layer.

3. The three-dimensional memory device of claim 2, wherein the electrically conductive layers comprise word lines and the three-dimensional memory device comprises NAND memory device.

4. The three-dimensional memory device of claim 1, wherein the charge storage layer comprises a silicon nitride layer and the gate dielectric comprises aluminum oxide.

5. The three-dimensional memory device of claim 4, wherein:
the first tunneling dielectric comprises a first silicon oxide layer; and
the second tunneling dielectric comprises a second silicon oxide layer.

6. The three-dimensional memory device of claim 4, wherein:
the first tunneling dielectric comprises a stack of a silicon oxide layer, a silicon nitride layer, and an aluminum oxide layer; and
the second tunneling dielectric comprises an aluminum oxide layer.

7. The three-dimensional memory device of claim 1, wherein:
each of the vertical semiconductor channels comprises a semiconductor material having a doping of a first conductivity type; and
each of the memory opening fill structures comprises a drain region contacting a top end of a respective vertical semiconductor channel and having a doping of a second conductivity type that is the opposite of the first conductivity type.

8. The three-dimensional memory device of claim 7, wherein:
the conductive core electrode comprises a doped semiconductor material of the second conductivity type; and
the drain region contacts a top end of a respective conductive core electrode, a respective first tunneling dielectric, a respective charge storage layer, and a respective second tunneling dielectric.

9. The three-dimensional memory device of claim 7, wherein the alternating stack is located over a semiconductor material layer of the first conductivity type containing a source region of the second conductivity type.

10. The three-dimensional memory device of claim 9, wherein each of the vertical semiconductor channels contacts a top surface of the semiconductor material layer.

11. The three-dimensional memory device of claim 9, wherein each of the memory opening fill structures further comprises a pedestal channel portion contacting a top surface of the semiconductor material layer and bottom surfaces of a respective vertical semiconductor channel.

12. The three-dimensional memory device of claim 9, wherein each of the memory opening fill structures further comprises an insulating spacer located over a horizontal bottom surface of the vertical semiconductor channel and under a bottom horizontal surface of the memory film.

13. The three-dimensional memory device of claim 1, each of the memory opening fill structures further comprises:
a dielectric core that is laterally surrounded by the conductive core electrode; and
a drain region contacting a top surface of the dielectric core.

14. The three-dimensional memory device of claim 13, further comprising an air gap located in the dielectric core.

15. The three-dimensional memory device of claim 1, wherein a portion of an outer sidewall of the vertical semiconductor channel contacts a source layer, and the source layer is located over peripheral devices.

16. The three-dimensional memory device of claim 1, wherein:
the memory openings comprise a two-dimensional array of discrete memory openings that are laterally spaced apart from each other; and
each of the vertical semiconductor channel, the first tunneling dielectric, the charge storage layer, and the second tunneling dielectric has a respective tubular horizontal cross-sectional shape.

17. The three-dimensional memory device of claim 16, wherein:
the first tunneling dielectric contacts an inner sidewall of the vertical semiconductor channel;
the charge storage layer contacts an inner sidewall of the first tunneling dielectric;
the second tunneling dielectric contacts an inner sidewall of the charge storage layer; and
the conductive core electrode contacts an inner sidewall of the second tunneling dielectric.

18. A method of forming a semiconductor structure, comprising:
forming an alternating stack of insulating layers and spacer material layers over a substrate, wherein the spacer material layers are formed as, or are subsequently replaced with, electrically conductive layers;
forming memory openings extending through the alternating stack; and
forming memory opening fill structures within the memory openings,
wherein:
each of the memory opening fill structures comprises a vertical semiconductor channel, a conductive core electrode, and a memory film located between the vertical semiconductor channel and the conductive core electrode; and
the memory film comprises a layer stack including a first tunneling dielectric contacting the vertical semiconductor channel, a second tunneling dielectric contacting the conductive core electrode, and a charge storage layer located between the first tunneling dielectric and the second tunneling dielectric.

19. The method of claim 18, further comprising forming a gate dielectric between an outer sidewall of each of the vertical semiconductor channels and each of the electrically conductive layers.

20. The method of claim 18, wherein:
the layer stack is formed by sequentially depositing the first tunneling dielectric, the charge storage layer, and the second tunneling dielectric; and
the conductive core electrode is formed on an inner sidewall of the second tunneling dielectric and vertically extends through each level of the electrically conductive layers.

* * * * *